United States Patent
Brown

(10) Patent No.: US 10,732,212 B2
(45) Date of Patent: Aug. 4, 2020

(54) IMPEDANCE ISOLATED LOWER VOLTAGE AND WIRED DATA COMMUNICATION NETWORK

(71) Applicant: Sun Digital Systems Inc., Fort Lauderdale, FL (US)

(72) Inventor: John Dennis Brown, Fort Lauderdale, FL (US)

(73) Assignee: SUN DIGITAL SYSTEMS INC, Fort Lauderdale, FL (US)

( * ) Notice: Subject to any disclaimer, the term of this patent is extended or adjusted under 35 U.S.C. 154(b) by 27 days.

(21) Appl. No.: 16/176,937

(22) Filed: Oct. 31, 2018

(65) Prior Publication Data

US 2019/0128936 A1    May 2, 2019

Related U.S. Application Data

(60) Provisional application No. 62/580,122, filed on Nov. 1, 2017.

(51) Int. Cl.

| | |
|---|---|
| *H04B 3/54* | (2006.01) |
| *G01R 27/28* | (2006.01) |
| *H04L 29/12* | (2006.01) |
| *G01R 31/00* | (2006.01) |
| *G01R 29/08* | (2006.01) |

(52) U.S. Cl.
CPC .......... *G01R 27/28* (2013.01); *G01R 29/0842* (2013.01); *G01R 31/002* (2013.01); *H04B 3/54* (2013.01); *H04L 61/103* (2013.01); *H04L 61/6022* (2013.01)

(58) Field of Classification Search
CPC combination set(s) only.
See application file for complete search history.

(56) References Cited

U.S. PATENT DOCUMENTS

| 5,406,249 A * | 4/1995 | Pettus | H04B 3/56 340/12.37 |
|---|---|---|---|
| 6,751,315 B1 * | 6/2004 | Liu | H04M 19/00 370/488 |
| 7,729,375 B2 * | 6/2010 | Miyazaki | H04B 3/542 340/310.11 |
| 8,750,394 B2 * | 6/2014 | Abad Molina | H04B 3/542 375/257 |
| 2004/0160990 A1 * | 8/2004 | Logvinov | H04B 3/542 370/509 |
| 2005/0047379 A1 * | 3/2005 | Boyden | H04B 1/7163 370/338 |
| 2007/0091925 A1 * | 4/2007 | Miyazaki | H04B 3/58 370/469 |

(Continued)

*Primary Examiner* — Raymond N Pham
(74) *Attorney, Agent, or Firm* — Mark C. Johnson; Johnson Dalal

(57) ABSTRACT

A data communication network that includes a wired network operably configured to transfer data at a rate between 100 Mbps to 500 Mbps over ordinary wire of the type used for low power electric distribution. This may be accomplished through use of two or more communication nodes each, respectively, including an Ethernet port electrically coupled to a first external power source at a lower voltage and including an AC/DC low pass filtering circuit and a LISN circuit configuration and communicatively coupled to one another through a wired connection, forming a wired network operably configured to exchange data between one another.

20 Claims, 15 Drawing Sheets

(56) References Cited

U.S. PATENT DOCUMENTS

| | | | |
|---|---|---|---|
| 2013/0235619 A1* | 9/2013 | Zhou | H01F 27/2885 363/21.04 |
| 2014/0292353 A1* | 10/2014 | Yang | G01R 31/001 324/613 |
| 2016/0277070 A1* | 9/2016 | Soman | H04L 7/0079 |

* cited by examiner

IMPEDANCE ISOLATED LOWER VOLTAGE AND WIRED DATA COMMUNICATION NETWORK

CROSS-REFERENCE TO RELATED APPLICATION

This application claims priority to U.S. Provisional Patent Application No. 62/580,122 filed Nov. 1, 2017, the entirety of which is incorporated by reference.

FIELD OF THE INVENTION

The present invention relates generally to a wired communication network, and, more particularly, relates to an impedance isolated network power source or sources, power load or loads, and the communication interface.

BACKGROUND OF THE INVENTION

The ever-expanding desire for instant and ubiquitous communications is recognized by major technology companies such as Qualcomm, Intel, AT&T and many more giving rise to the Internet of Things (IoT) concept. All electrical equipment will be intra connected and inter connected to the World-Wide Internet Web network by Ethernet. Home appliances, from refrigerators to the family swimming pool, will get "smarter," improve function, safety and deliver lower maintenance costs. Smart homes, smart cars, smart boats, smart power grids and smart cities are transitioning to internet communications between any device powered by electricity. Powerline Communications enabling IoT via AC power mains is well established under the HomePlug standard. Sun Digital Systems Powerline Communications ("SDSPLC") will make that transition possible in mobile systems utilizing lower voltage power distribution wiring. The communication signal and electrical power are delivered on the same wire pair.

The demand for all types of information including text, audio, video and high-speed/low-speed data streams has increased dramatically. The number of users of this data at multiple locations has expanded just as rapidly. The need to improve high data rate delivery and reliability of information exchange to a large and growing number of locations or nodes within a vehicle, vessel, aircraft or a fixed land-based system operating on lower voltages has surpassed present technologies ability to fulfill these needs. SDS Inc Powerline Communications delivers Ethernet information transmission over common power wiring now used to distribute lower voltage, high current electrical energy such a 12 Volts throughout a system. This application present special problems solved by SDSPLC technology. There is no need to add communication wiring. SDSPLC developed unique circuits to achieve cost effective impedance isolation between the power source(s) or power load(s) and the communication interface enables deliver of high-speed Ethernet data. SDSPLC impedance conditioning makes high current, low impedance equipment wiring compatible with high performance Powerline Communications technology.

Impedance isolation enables SDS Powerline Communications products to provide the lowest cost, highest data rate, energy efficient bidirectional, transparent, impedance modulation tolerant conducted communications system meeting the needs of modern lower voltage systems. SDSPLC uses the same data format and is compatible with radiated communications or wireless schemes such as Wi-Fi. Radiated and SDSPLC conducted communication complement each other and may coexist in the same system forming a high reliability redundant Ethernet communications network with no network management overhead. Information is highly available anywhere and everywhere by using both wired and wireless communication methods. As part of a hybrid network, SDSPLC enabled equipment support wired devices while freeing up wireless bandwidth for mobile devices not permanently connected to power distribution wiring. This improves radiate data bandwidth available to equipment that can only access information via the wireless network. In many cases conducted communications is more reliable than wireless communications because impairments are easier to manage than atmospheric and radio interference.

SDSPLC utilizes conducted communication technology to modulate plain, low cost, lower voltage power wiring to deliver Ethernet data to multiple locations throughout a mobile or fixed base system. When appropriate impedance isolated Powerline Communications, SDSPLC may be powered by a lower voltage power source like solar energy with local battery storage backup for continuous operation regardless of the time of day or utility power grid status. Two nodes consume less than 4 watts at full 100 to 250 Mbps data rate. Only one node transmits at a time per IEEE802.3 protocol so a large number of nodes is supported by low power signal energy. Nodes automatically go into sleep mode unless data traffic is present. SDSPLC conserves energy at every data node by operating at low power levels and switching to sleep mode whenever possible and yet reverting back to high speed mode when needed.

SDSPLC inventions fill the need for faster, highly available communications over longer distance without adding the expense of installing special wiring such as Ethernet Category data cable. A simple connection to lower power wiring is all that is required. As the need for multi-point broadband data access expands and the number of networked machine to machine and network to user communications grows. SDSPLC technology delivers high speed, reliable communications over wired networks without Ethernet wire. SDSPLC fills the need for conducted communications without adding any new specialized wiring to an existing wired vehicle, vessel or aircraft. Optionally, highest performance is achieved by adding impedance isolation to the network power source or sources and/or power loads.

SDSPLC technology turns any lower voltage plain wire distribution wiring system into an Ethernet communications network while still delivering electrical power to each node. SDSPLC is a Ethernet Powerline bridge compliant with the IEEE 802.3 standard and delivers a communications channel up to 250 Mbps. This is accomplished over any pair of plain hookup wires. Lower data rate, lower cost implementations are compatible with and operate on the same high speed wired network. All data rate performance presented here are the actual delivered, usable UDP or TCP data rate values in Mbps. The symbol or PHY rates are 2 or more times higher than the delivered data rates presented in this document. PHY data rate has little meaning to the end user so we use real delivered data rate.

Therefore, a need exists to overcome the problems with the prior art as discussed above.

SUMMARY OF THE INVENTION

The invention provides an impedance isolated network power and wired data communication network that overcomes the hereinafore-mentioned disadvantages of the heretofore-known devices and methods of this general type. Specifically, this disclosure describes standard based circuits and specialized methods of multi-point data communications over low power distribution wiring.

The invention provides an impedance isolated low power and wired data communication network that overcomes the hereinafore-mentioned disadvantages of the heretofore-known devices and methods of this general type and that effectively and efficiently enables communication between two or more nodes in a low power environment.

With the foregoing and other objects in view, there is provided, in accordance with the invention, an impedance isolated low power and wired data communication network having first and second communication nodes each, respectively, including an Ethernet port electrically coupled to a first external power source at a lower voltage and including an AC/DC low pass filtering circuit and a Line Impedance Stabilization Network ("LISN") circuit configuration interposed between the first external power source and the first and second communication nodes. The first and second communicates notes are also communicatively coupled to one another through a wired connection, forming a wired network operably configured to exchange data between one another.

In accordance with another feature, an embodiment of the present invention includes an auxiliary AC/DC low pass filter and LISN configuration creating a backup power source should the first external power source fail.

In accordance with a further feature of the present invention, the first and second communication nodes are communicatively coupled to one another through a paired wired connection, wherein the paired wired connection is of a metallic and/or electrically conductive material, for example, copper.

In accordance with an additional feature of the present invention, the paired wired connection is of a twisted configuration spanning from the AC/DC low pass filtering circuit and the LISN circuit configuration to the first communication node.

In accordance with a further feature of the present invention, the lower voltage is within a range of approximately 6-55V.

In accordance with yet another feature, an embodiment of the present invention also includes a Wi-Fi network of communication devices communicatively coupled together and operably configured to enable Internet connectivity, the wired network formed by the first and second communication nodes is a supplemental and redundant network associated with the Wi-Fi network. Additionally, the Wi-Fi network and wired network may be operably configured to independently and simultaneously exchange data.

In accordance with an additional feature of the present invention, the wired network is operably configured to exchange data between one another at a rate from approximately 1 Kbps to 250 Mbps.

In accordance with a further feature of the present invention also includes the first and second communication nodes having an integrated circuit generating a unique Media Access Control hardware address.

Although the invention is illustrated and described herein as embodied in an impedance isolated low power and wired communication network, it is, nevertheless, not intended to be limited to the details shown because various modifications and structural changes may be made therein without departing from the spirit of the invention and within the scope and range of equivalents of the claims. Additionally, well-known elements of exemplary embodiments of the invention will not be described in detail or will be omitted so as not to obscure the relevant details of the invention.

Other features that are considered as characteristic for the invention are set forth in the appended claims. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one of ordinary skill in the art to variously employ the present invention in virtually any appropriately detailed structure. Further, the terms and phrases used herein are not intended to be limiting; but rather, to provide an understandable description of the invention. While the specification concludes with claims defining the features of the invention that are regarded as novel, it is believed that the invention will be better understood from a consideration of the following description in conjunction with the drawing figures, in which like reference numerals are carried forward. The figures of the drawings are not drawn to scale and the schematics are used only to facilitate in enabling the disclosure of the present invention, thereby said schematics shall not necessarily be limiting. Said another way, the figures show only a few of the many possible wiring arrangements, and others will be appreciated by those of skill in the art.

SDSPLC is electronic apparatus for IEEE802.3 conducted data communication between any two or more locations or nodes connected by a network of ordinary wires forming a wire pair. This wire pair is the Powerline ("PL") communication and power distribution bus. SDSPLC modules create a high speed, low power consumption Ethernet network powered by only two wires to each node. The transparent, self-managed bidirectional communications channel between any two or more nodes form a general purpose self-powered, multidrop, CDMA Ethernet data network. There is no need for a network hub or any external management hardware or software support. Considerable cost savings result from this low cost two-wire arrangement. High end implementation can support up to five independent data channels of up to 100 Mbps each simultaneously in the PL wire pair. Any low-cost physical wire pair may be used without regard to wire specification, insulation or wire spacing or any other wire consideration. The common wire pair provides the communications signal medium and may or may not distribute AC or DC electrical power to all nodes. SDSPLC is General Product Safety Directive ("GPSD") compliant and operates below the voltage range of the global standard; Low Voltage Directive ("LVD") 2014/35/EU. Impedance isolated power, Powerline Communications embodied by SDSPLC operates at voltages generally below 30 volts AC or 55 volts DC when powered by the communication wire pair. SDSPLC is not designed for and is not compatible with common 110 or 220 VAC utility power from a wall outlet. Proprietary protection circuits disable the SDSPLC device if erroneously connected to any voltage above the proper operating range.

Conducted SDSPLC communications described here may be the primary or secondary system. It may be used to create a backup communication channel for wireless networks. Multiple SDSPLC channels may exist on the same wire pair but will share the maximum data rate limit of 500 Mbps. SDSPLC is compatible with and may be implemented in addition to other communications networks such as radiated Ethernet data communications provided by various forms of Wi-Fi. The opportunity to compare two or more data streams one from radiated and the other from conducted communications equipment will improve the integrity of the information and enhances the reliability of the overall communications system. A cross reference data test system is easily implemented to assure the highest data accuracy and reliability forming a fault tolerant network. A hardware failure is recognized immediately.

SDSPLC delivers full data rate HompPlug (HP) Ethernet UDP/TCP Communication standard but utilizes common Low Power plain electrical power wiring. Conversely HomePlug® (HP) utilizes Powerline Communications (PLC) technology originally designed to operate on 100/265 VAC typically 50/60 Hz "power lines" powered by the electrical utility company. HomePlug® equipment complies with the Low Voltage Directive Standard (LVD) 2014/35/EU. Some literature may refer to AC power lines as AC mains. HP operates on AC power lines or mains found in any typical home or office via the two or three pin wall receptacle outlets. Global outlet standards vary. This type of HP equipment is generally in a fixed location or fixed base environment operating under the Low Voltage Directive. SDSPLC is a specialized lower voltage, lower energy communication technology deployed on power distribution wiring usually found in but not limited to mobile systems. The SDSPLC operating environment is unique and requires exceptional impedance isolation circuits designed to operate in a high performance, low power environment. These circuit designs, techniques, methods and SDSPLC technology are the basis of this patent. SDSPLC are a group of product technologies that combine to deliver the lowest cost, highest performance Ethernet communication network on common electrical wire used in lower voltage power distribution.

Using SDSPLC the same wires that provide electrical energy to operate equipment also provide the network wide data PL communication media. Specialized twisted-pair, coax cable or other expensive wiring is eliminated in many applications. Some applications may still use coaxial cable or twisted pair wire when long wire length is mandatory and cost acceptable. All communication signal wiring is eliminated. A plain wire pair connects all nodes of the network delivering both electrical (AC or DC) energy and bidirectional Ethernet communication data to all SDSPLC nodes. An Ethernet network may consist of as many as 64 SDSPLC technology enabled nodes in a simple network system or as many as 255 nodes in some installations with the addition of supporting circuits to condition the wiring. There may be multiple linked IP addressed networks systems making up a much larger Ethernet network numbering in thousands of nodes. SDSPLC is compatible with such Ethernet systems and can act as an extension to those wired or wireless radio communication systems. SDSPLC compatible low power wiring may already exist in a vehicle, vessel or aircraft or it may be dedicated to this purpose in a new mobile system design. A specially designed and conditioned variation of this wiring arrangement may use multiple Line Impedance Stabilization Network (LISN) circuits to condition the power source by impedance isolation to improve data rate, reliability and communication distance with a small increase in cost. See a block diagram and Low Pass Filter with Line Impedance Stabilization Network (LPF-LISN) circuit example in FIGS. 3 and 6. The LPF-LISN can also be used to extract power from the low power wiring without impairing the performance of the network. Every SDSPLC node extracts a small amount of energy from the low power wiring to power the communication electronics.

Each physical location in a network has a unique node address. The node's Media Access Control (MAC) address is the most basic and provides unique point to point communications between any two or more node locations. A broadcast message can be received by all ports simultaneously by using a Host Processor's Internet Protocol (IP) address structure but incurs additional hardware cost. The SDSPLC bridging adapters form a transparent, bidirectional communication pipe enabling transfer of data addressed by either/or IP or MAC based address schemes. This enables node to node, computer to computer or node to computer communication throughout the network. Any location in the electrical distribution wiring system becomes an industry standard Ethernet port by means of the SDSPLC-Ethernet node technology. A node may offer a simple RJ45 Ethernet connector or an embedded subsystem with or without microcomputer host support of an IP address. SDSPLC-Ethernet nodes can provide a wide variety of multi-bit input/output digital data ports as well as analog I/O. SDSPLC-No Host option is also available eliminating the cost of the host processor. By adding a host microcomputer any number and type of I/O options are available Before the present invention is disclosed and described, it is to be understood that the terminology used herein is for the purpose of describing particular embodiments only and is not intended to be limiting. The terms "a" or "an," as used herein, are defined as one or more than one. The term "plurality," as used herein, is defined as two or more than two. The term "another," as used herein, is defined as at least a second or more. The terms "including" and/or "having," as used herein, are defined as comprising (i.e., open language). The term "coupled," as used herein, is defined as connected, although not necessarily directly, and not necessarily mechanically. The term "providing" is defined herein in its broadest sense, e.g., bringing/coming into physical existence, making available, and/or supplying to someone or something, in whole or in multiple parts at once or over a period of time.

As used herein, the terms "about" or "approximately" apply to all numeric values, whether or not explicitly indicated. These terms generally refer to a range of numbers that one of skill in the art would consider equivalent to the recited values (i.e., having the same function or result). In many instances these terms may include numbers that are rounded to the nearest significant figure. The terms "program," "software application," and the like as used herein, are defined as a sequence of instructions designed for execution on a computer system. A "program," "computer program," or "software application" may include a subroutine, a function, a procedure, an object method, an object implementation, an executable application, an applet, a servlet, a source code, an object code, a shared library/dynamic load library and/or other sequence of instructions designed for execution on a computer system.

BRIEF DESCRIPTION OF THE DRAWINGS

The accompanying figures, where like reference numerals refer to identical or functionally similar elements throughout the separate views and which together with the detailed description below are incorporated in and form part of the specification, serve to further illustrate various embodiments and explain various principles and advantages all in accordance with the present invention.

DETAILED DESCRIPTION

Figure 1:
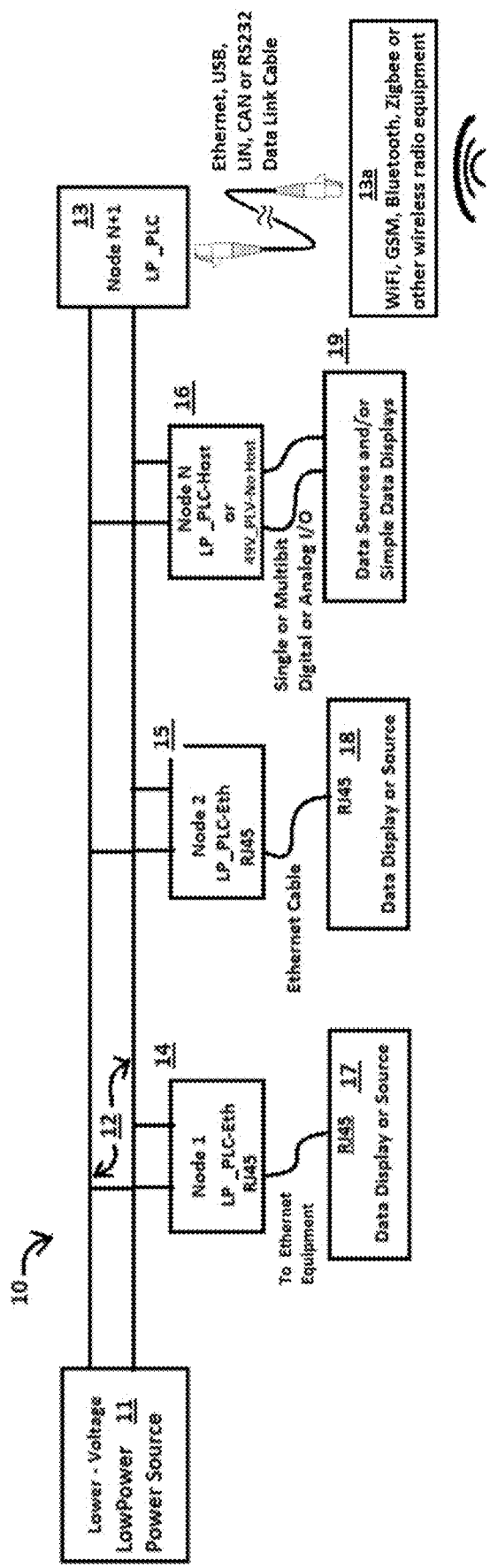
FIG. 1 is a wiring schematic depicting a lower voltage powerline communication ("SDSPLC") system with a two-wired self-powered non-impedance isolated communication network.

While the specification concludes with claims defining the features of the invention that are regarded as novel, it is believed that the invention will be better understood from a consideration of the following description in conjunction with the drawing figures, in which like reference numerals are carried forward. It is to be understood that the disclosed embodiments are merely exemplary of the invention, which can be embodied in various forms.

The present invention provides a novel and efficient lower voltage data communication network. The communication network provides users a communication bridge over plain wire forming a heterogeneous Ethernet network delivering data rates up to, and potentially exceeding, 250 Mbps at each node. Common wire provides both the electrical power to operate the network and the conducted communications signal medium. Aggregated data rate on the wire medium, Powerline Bus may reach 500 Mbps supporting multiple independent Ethernet channels each delivering up to 100 Mbps to multiple nodes concurrently. Such wired networks may interface directly to wireless subnetworks such as Wi-Fi or other radio communications supporting the Ethernet protocol.

Figure 3:
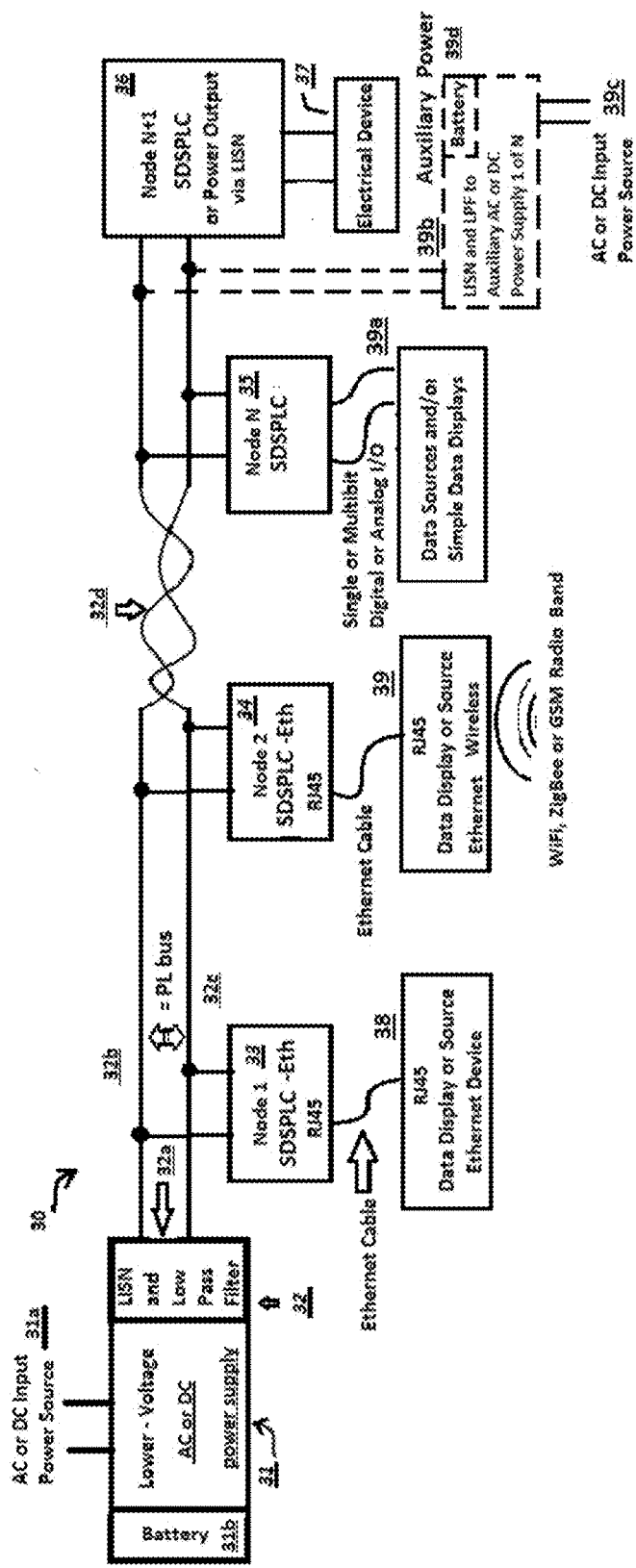
FIG. 3 is a wiring schematic depicting a self-powered SDSPLC with a LISN isolated power source to a LISN isolated power source(s) or load(s)

One embodiment, as depicted in FIG. 1, includes a data communication network that distributes electrical power through use of, for example, two conventional wires that provides both communication through a PL signal and electrical power via the wire media. FIG. 3 depicts an exemplary high performance and low-cost embodiment of the present invention. PL communication (sometimes referred to herein as "SDSPLC") is a specialized low power consumption, low cost communication technology developed specifically for lower voltage power distribution wiring found in, but not necessarily limited, to mobile systems such as vehicles, vessels or aircraft. There are numerous land-based applications for SDSPLC as well. Many architectures are possible including large numbers of Ethernet communications nodes separated by distance of hundreds of feet down to only a few nodes located only inches apart. A plurality of SDSPLC configurations exists, each with specific characteristics and advantages. Multiple auxiliary Power Sources isolated by LPF-LISN circuits maintain operation in the event primary electrical power is lost. SDSPLC technology results from decades of experience using global standards and rules-based design methods that optimize wired Ethernet communications. Some of the standards utilized in SDSPLC technology include the General Product Safety Directive (GPSD) 2001/95/EC, 10/100 IEEE802.3 Ethernet, IEEE802.15 Ethernet, IEEE 1901 Communication Standard and SDS Inc written Design Rules for SDSPLC Best Practice 2017 among others. SDSPLC technology is directly compatible with Wi-Fi and other Ethernet wireless radio communications standards. SDSPLC will not supplant Wi-Fi but will supplement radio network communications. Any equipment connected to a power source can be a SDSPLC node and Wi-Fi access point in a dual redundant communication network.

FIG. 3 represents a preferred wiring schematic depicting a self-powered SDSPLC with an LPF-LISN isolated power sources and load(s). Power and data are combined on only two wires therefore the impedance of the wire pair at the communication frequency band must be high enough, generally above 200 ohms at 2 MHz, so as not to attenuate the PL signal. Full optimized data rate and distance between nodes resulting from proprietary Low Pass Filters and Line Impedance Stabilization Network (hereinafter "LPF-LISN") circuits at the power source(s), power tap(s) is used throughout the system to optimize data rate and distance between modes. Multiple auxiliary Power Sources are possible and continue network operation in the event primary electrical power is lost. A hybrid system combines the best characteristics of SDSPLC conducted and Wi-Fi radiated communication networks.

The SDSPLC network includes a family of SDSPLC hardware, software, test fixtures, procedures and communication verification methods providing high reliability Ethernet data communications under worst case conditions. SDSPLC is a standard based product and technology that operates below the voltage range of the global Low Voltage Directive (LVD) 2014/35/EU. SDSPLC operates at voltages below LVD, that is below 50 VAC or below 75 VDC (hereinafter "lower voltage"). SDSPLC is not designed to plug into any wall outlet. SDSPLC solves the problems of operating at lower voltages thus higher resulting current yet still deliver fast Ethernet data rate. SDSPLC provides a multi-point, conducted signal, compliant with IEEE 802.3 Ethernet Communication Standard networks operating across plain wire operating below 50 VAC or 75 VDC used for power distribution wiring. SDSPLC is directly compatible with traditional wired Ethernet ports such as routers, hubs, Wi-Fi via a standard RJ45 802.3 Ethernet interface plug.

SDSPLC technology and products are the result of rules and standards-based design knowledge. SDSPLC design rules were developed over a decade of experience with PLC operating on LVD products for Home Plug.

Figure 12:
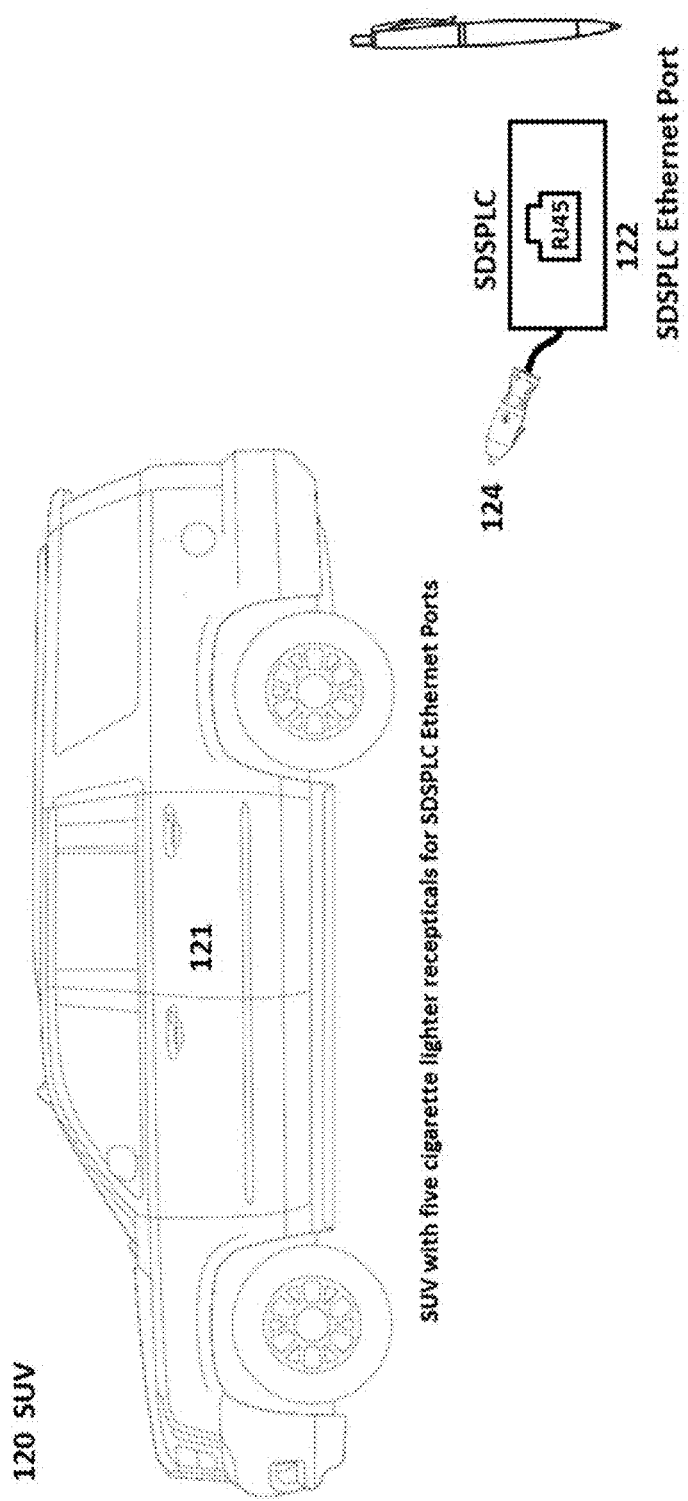
FIG. 12 are illustrations of an exemplary SDSPLC Ethernet modem and mobile system incorporated into a vehicle, specifically an SUV.
Figure 13:
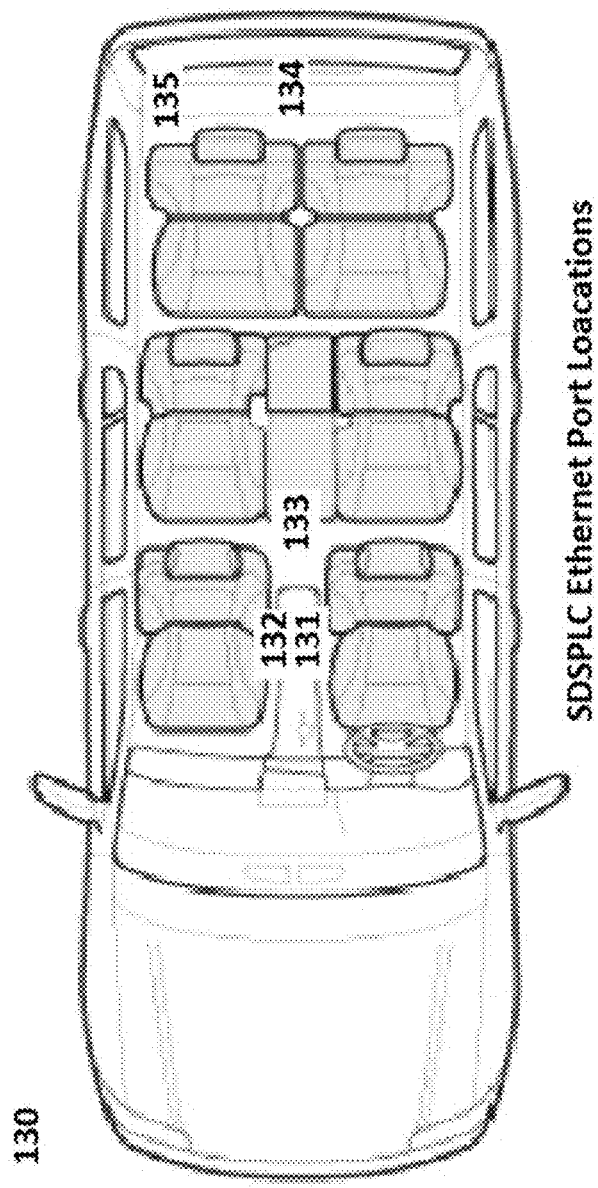
FIG. 13 is an illustration of exemplary node locations employed within the SUV of FIG. 12.

Referring now to the drawing figures, in which like reference designators refer to like elements, there is shown in FIG. 1 an exemplary PLC communication system generally designated as "10". The elements of this system are the unconditioned lower Power Source 11 providing electrical energy to the network by means of the wire pair 12. The lower voltage source provides electrical energy for Ethernet nodes 14, 15, Hosted Node 16 and a remote node 13 located at a distance of approximately 20-50 feet. An example of this simple SDSPLC two-wire network is depicted in FIG. 12 and FIG. 13 (depicting exemplary SDSPLC node locations in an SUV Mobile System). Specifically, FIG. 12 shows SDSPLC-Ethernet Modem and Mobile System Example in Sport Utility Vehicle (SUV) depicts a DC powered example of SDSPLC technology suitable to most cars, trucks and RVs.

Applications depicted in FIG. 1 are appropriate for vehicle, vessel or aircraft combining Ethernet communications and power distribution over a shorter distance of about 30 feet. Conducted high frequency PL signal energy transfers data on any pair of plain copper wires 12 at distances of inches to tens of feet given correct node placement, impedance and architecture. Common power distribution wires may already exist and will provide the communication media and distribute lower-voltage AC or DC electrical energy to power the SDSPLC communication equipment nodes' power. Those of skill in the art will appreciate that the Power Source 11 has no special characteristics other than it could provide enough current at the proper operating DC voltage or AC power at 60 Hz or less. In that regard, the impedance of 11 must be low enough to provide the required voltage and load current. The low impedance of 11 at SDSPLC communication frequencies attenuates the communication signal strength reducing the data rate, number of nodes, and maximum distance between nodes. In mobile applications depicted in the SUV illustration FIG. 12, this limitation is acceptable.

Figure 8A:
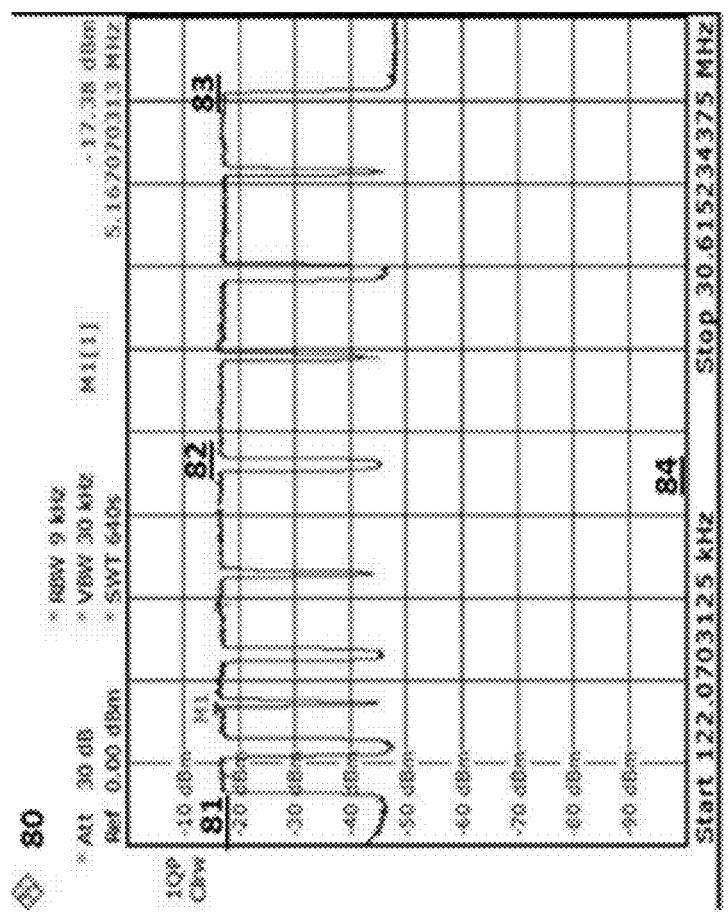
FIG. 8a is a chart depicting an exemplary SDSPLC High Frequency (2 to 30 MHz) HF band communication signal.
Figure 8B:
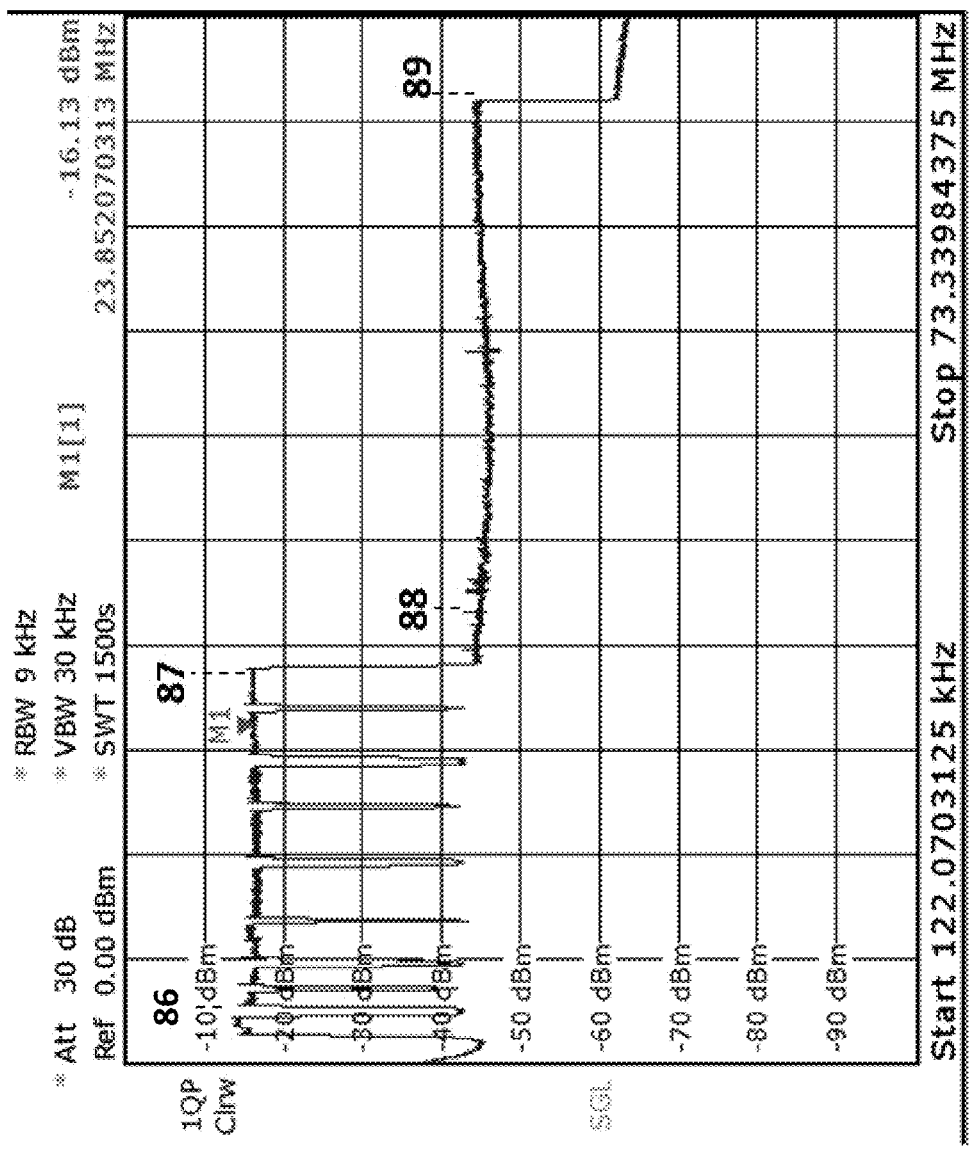
FIG. 8b is a chart depicting an exemplary dual HF and VHF band version of a SDSPLC communication signal.

Referring once again to FIG. 1, there is no impedance conditioning by the Low Voltage Source 11 so it attenuates the communications PL signal shown in FIGS. 8*a-b* inversely proportional to the Power Source impedance. Signal attenuation reduces the data rate and maximum distance between nodes thus limiting the number of suitable PLC nodes and applications. As those of skill in the art will appreciate, the amount of attenuation is inversely proportional to the impedance of the wire pair at the physical terminal of Node #1 at location 12, but the inductance of the connecting wire pair from 11 increases that impedance thus improving performance. For 20-foot long vehicle there may be as little as 4 feet of a wire pair's inductance or about 16 uH which is enough for SDSPLC operation. This would provide satisfactory results in many applications. Each node's SDSPLC circuits also have parallel capacitance at the input also attenuating the SDSPLC signal. So, there is an upper limit to the number of nodes this unconditioned power arrangement can support. As depicted in FIG. 1 the SDSPLC technology would deliver 40 to 60 Mbps between most nodes for typically 30 to 40 nodes in this system. In many applications, this limitation may be acceptable especially since the SDSPLC system can be instantly installed in an existing vehicle post production without modifications. With reference briefly to FIGS. 12-13, the SDSPLC module 122 and a cigarette lighter plug 124 inserted into any location 131 and immediately establishes an Ethernet node at that location in the SUV shown in FIG. 12.

Node 1 and 2 in FIG. 1 are identical but may be separated by approximately 2 to 50 feet. The wire pair 12 provides the Ethernet communication wire media between the network node numbers 1, 2, N through N+1 and electrical power for the node. There is no dedicated Ethernet cable between nodes, only the plain wire pair yet SDSPLC technology is delivering the same data rate as a dedicated point to point physical Ethernet cable. Eliminating the wire cable expense and installation labor is a significant system cost and weight reduction. At least one half of the system wiring and wire connections are eliminated by virtue of SDSPLC technology. Node #1 14 is a transceiver providing data to and from all nodes from Data Display or Data Source 17. The same is true for all nodes. Data Source 17 could be a keyboard, PC or any device with an Ethernet RJ45 interface. A variety of application examples have been developed and tested using the 12 VDC electrical wiring system of a passenger car, SUV, or RV as show in FIGS. 12-14. Node N is designated as 16 is a hosted port useful for single or multiple bit digital or analog input or output data from sensors or data displays. The last node 13 might be the 40th Node of a large array of closely located nodes and seamlessly interface to a wireless communications network using radio communications such as Wi-Fi. All five examples in FIGS. 1-5 could also have portions of the network supported directly by wireless Ethernet technology. The SDSPLC wired bridge communication modem protocol and data format are directly compatible with Wi-Fi and can extend the range of Wi-Fi as in Node marked 13.

Figure 2:
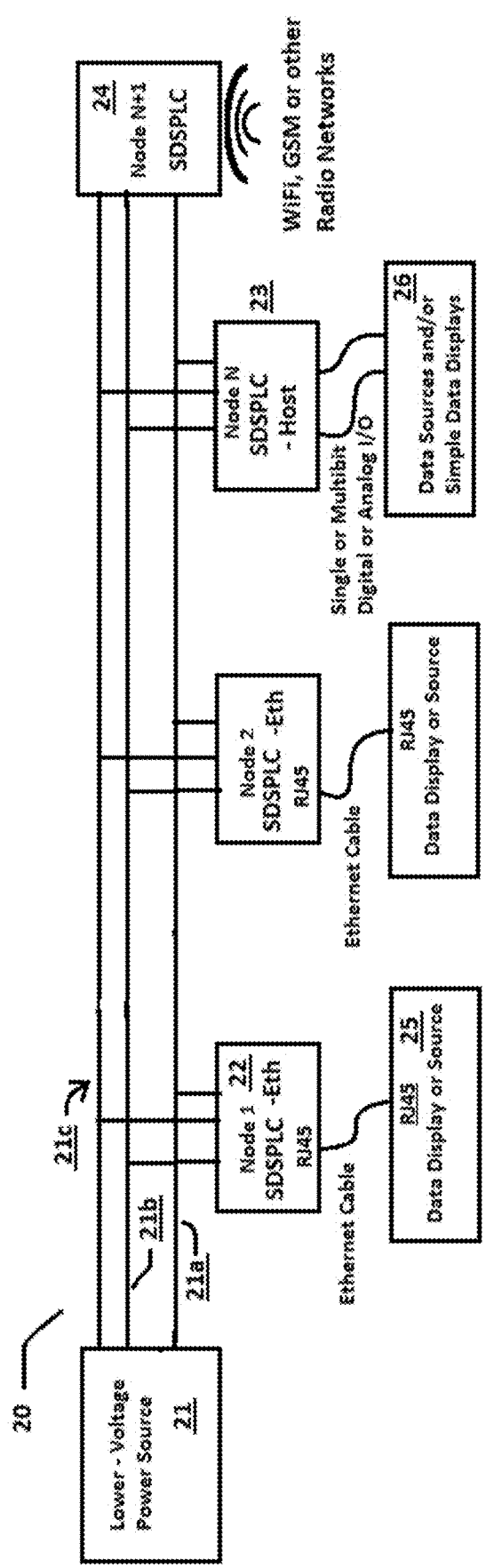
FIG. 2 is a wiring schematic depicting a SDSPLC with a three-wired communication network.

Referring now to FIG. 2, a system identified as 20 is depicted. The data rate and maximum distance between nodes can be improved from the configuration depicted in FIG. 1 by adding a third wire to deliver only the DC or AC electrical energy needed to operate the SDSPLC modems. There is no compromise due to power supply loading. The disadvantage of a three-wire system beyond the obvious cost and weight of the wire is mobile systems seldom have the additional third wire installed. As such, this three-wire configuration limits the applications to new equipment/designs only. This is just one more example of how SDSPLC could be used.

This third wire 21*c* would have a very low impedance power supply source in the order of milli-ohms so as to provide as much current as needed by a large number of SDSPLC nodes. This arrangement may be suitable for new equipment designs where a three-wire arrangement is "designed in" from the start and has acceptable cost. This arrangement is used in some PLC applications such as Plug in Electric Vehicle (PEV) charging stations or Electric Vehicle Supply Equipment (EVSE) because the charging cable must have adequate capacity and already has a number of conductors as defined by J1772 charger standard receptacle. The cable may deliver 25 to 75 KW in a short amount of time to supply enough energy to replenish the propulsion battery of a vehicle, vessel or aircraft. A much better architecture is available for both existing and new communication especially in mobile systems in the preferred embodiment.

Another example of this wiring topology is addressable alarm systems such as fire or intrusion detection. A single power supply with battery backup is used to assure operation of the entire system even when there is no utility AC power.

Each location is identified by a unique MAC address, so an abnormal situation is easily located.

FIG. 3 depicts a preferred self-powered SDSPLC embodiment of the present invention with a LISN isolated power source and LISN Isolate Power Load. The SDSPLC Ethernet network 30 depicted in FIG. 3 may be powered by the communications media. Said another way, the same two wires 32a and 32c that convey the PL Ethernet communication signal 80 (as depicted in FIGS. 8a-b) also delivers the electrical power needed by each node. A single high quality, low noise power supply 31 powers the entire system. This power supply could also have auxiliary battery power 31b to continue communications even when primary power 31a or utility AC power was not available. Furthermore, and auxiliary source of power 39b would automatically sustain the network in the event the primary power source 31a failed. This second energy source delivers 100% redundancy and may be only one of several auxiliary sources of electrical energy to operate the network.

The communication signal output impedance, generally about 10 ohms, is in parallel with the impedance isolated SDSPLC nodes input and the impedance isolated system power supply 31 or supplies 39b. The SDSPLC input receive mode impedance, generally about 400 to 500 ohms, at each node must be high enough to allow multiple nodes in close proximity. The total load impedance is the sum of all parallel loads at the respective communications frequency, that is 2 to 30 MHz or 2 to 67.5 Mhz. The LISN DC (or low AC frequency) impedance must be low enough to supply electrical energy to the network yet exhibit a high impedance (greater than approximately 400 ohms) in the communication frequency band so as not to load down the PL signal. These two conflicting requirements are met by the inclusion of special conditioning LISN and LPF circuits that make it possible to accomplish both functions at reasonable cost with little signal attenuation. The quality and design of these conditioning circuits is key to overall SDSPLC network performance.

The circuits of 32 provide a Low Pass (LP) filter and Line Impedance Stabilization Network (LISN) 32 (as depicted best in FIG. 6) at the output of the Low Power PLC power supply 31. The LP circuits allow low frequency AC or DC electrical energy to pass from 31a to 32a but isolate any external PL signal energy from any other PLC networks that would interfere with the intended SDSPLC communications. Any external PL signal will consume bandwidth and reduce the network data rate. The LISN circuit also provides the constant 32a impedance, about 500 ohms to present a high load impedance to the SDSPLC communication signal. Circuits of the LP filter and LISN, identified by 32 are essential and unique for best data rate and longest physical distance between SDSPLC nodes. Power conditioning of the SDSPLC supply energy improves performance of all key system parameters. Low background noise, constant impedance over the PL communications band and low parasitic capacitance between wire at 32b, 32c and to ground provide a balanced, differential PL communication signal wire pair at 32a.

Theoretically a perfectly balanced differential wire pair conducting Radio Frequency (RF) signal will not radiate any energy, thus all the communication signal energy is delivered to the communication wired network. As a result, higher communication signal strength or power level may be used and still comply with global radiated and conducted regulations. FIG. 8a depicts standard signal strength of −50 dBm/Hz and 30 MHz bandwidth of the PL signal as displayed 80 on a spectrum analyzer. FIG. 8b, however, depicts a dual band version of the SDSPLC using both HF and VHF bands. Specifically, FIG. 8b depicts a High Frequency (HF) band from 2 to 30 MHz (86 to 87) and the Very High Frequency (VHF) band (88 to 89) used by SDSPLC communications signals. As such, diversity of communications frequency bands adds to the likelihood that communications will be more reliable over a longer physical range, provide higher data rate and less subject to noise, and attenuation and signal impairments than single band communications. Impairments like temporal impedance modulation have less impact with a two-band communication scheme.

An additional improvement is available utilizing a twisted wire pair 32d scheme to further reduce radiated energy. The twisted pair cancels magnetic fields, therefore radiated energy produced by any unbalance of the transmission line and helps to reduce spurious RF emission without the expense of a metal shielded cover over the wire pair. In practice, it is difficult to obtain a perfectly balanced transmission line in real-world applications, but the twisted pair helps reduce radiated interference and noise pickup. The input circuit of each node is carefully designed to achieve as close as possible a symmetrical balanced transmission line input circuit. These circuits and component placement rules are unique to SDSPLC. The wire pair 32d could also represent a 50 to 100-ohm coax cable or twin axial cable if distance between nodes warranted the additional expense.

The LP filter and LISN circuits not only provide low noise power (less than −100 dBm) and a stable impedance load on the wire pair but also isolate external noise or communications signals from the AC or DC Input Power Source 31a. Any SDSPLC signal from outside 31a of the intended network will reduce the usable bandwidth of the network, thus reducing the data rate of the intended network 32a, shown best in FIG. 3, which depicts a preferred self-powered SDSPLC embodiment with an LISN isolated power source.

The above-mentioned LISN and LP circuits, component placement, wire rules and Printed Circuit Board (PCB) design deliver the highest possible data rate, longest distance between nodes and generally highest date rate Ethernet conducted communications possible. Other essential equipment may also use this power to some extent when isolated from the communications signal wire pair by LISN and low pass filter networks. This equipment may be data sources, computers, displays or any device compatible with Ethernet communication signal rules found in SDS PLC Design Rule 2016.

SDSPLC data communications use PL signal energy depicted in FIGS. 8a-b are conducted on two or more wires or coax as opposed to radio, radiated or wireless signal communications. SDSPLC is directly compatible with and can provide an alternative communication channel to wireless methods. SDSPLC can provide redundancy to radiated communications systems and free up wireless bandwidth for nodes not connected to power wiring. SDSPLC can be an extension to radiated communications standard equipment such as 802.1, Wi-Fi, Bluetooth, ZigBee and other compatible radiated signal communication equipment. SDSPLC can easily act as a conducted Ethernet signal backbone over extended distances and deliver higher data rate than Wi-Fi alone. Said another way, a sometimes primary and Wi-Fi network of communication devices (e.g., Wi-Fi router, Wi-Fi hub, etc.—generally referred to as Wi-Fi communications) may be communicatively coupled together and is operably configured to enable Internet connectivity to the world wide web. The wired network formed by the first and second communication nodes, e.g., nodes 14, 15, may be a supplemental and redundant network associated with the Wi-Fi network. As such, Wi-Fi communications and the SDSPLC form independent, simultaneous double redundant data networks. Data communications continues on one or both networks regardless of the functionality of the other.

Figure 4:
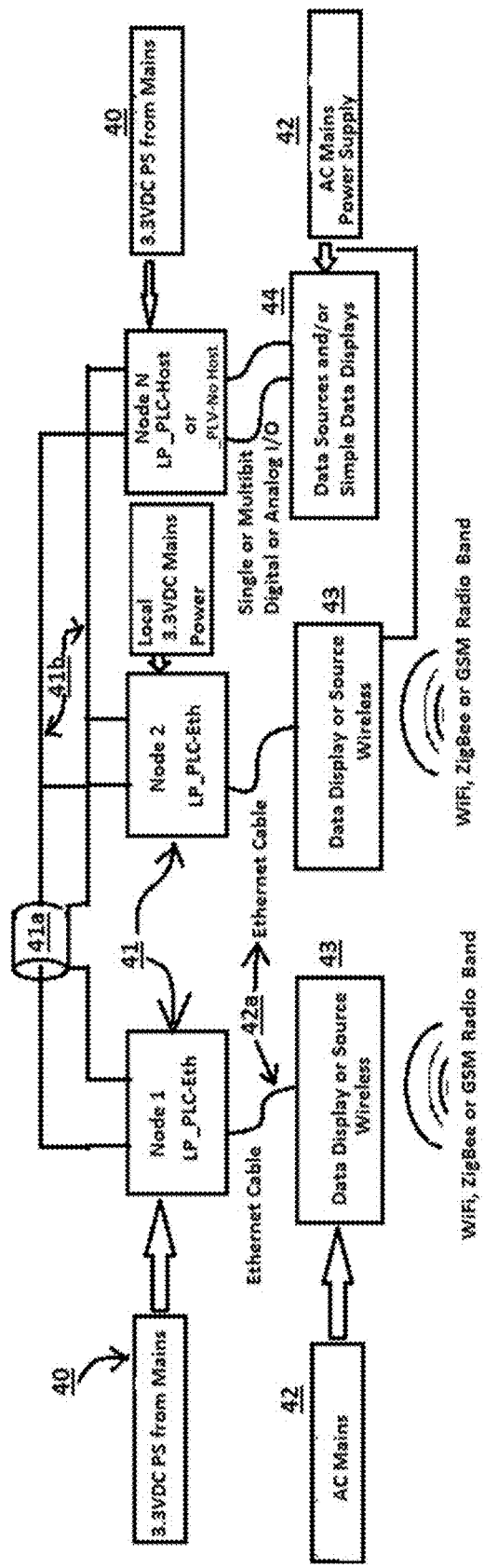
FIG. 4 is a long-distance wiring schematic depicting a SDSPLC with multiple external power source(s) at each node.

FIG. 4 depicts a long distance SDSPLC with External Power Source at Each Node. More specifically, FIG. 4 is a block diagram depicting a SDSPLC system using external electrical power at each node. This embodiment could be used in a single wire pair or coaxial cable conductor applications requiring communications over longer distances where the voltage drop due to resistance of the wire becomes excessive. This embodiment has been tested to distances of 3000 meters. There is no power distribution by the wired communications media so the supply voltage of the SDSPLC electronics, usually 3.3 VDC 40 is provided locally. There is no need for the LISN circuit. This supply voltage is still very high quality, ultra-low noise, electrically quiet across the PL band to below −100 dBm and duplicated at every node. The cost of this system is higher than the first three examples due to these requirements. A coax cable 41A extends the distance between nodes to several miles. Some nodes may still use plain wire 41b for the local communication media as appropriate.

Figure 5:
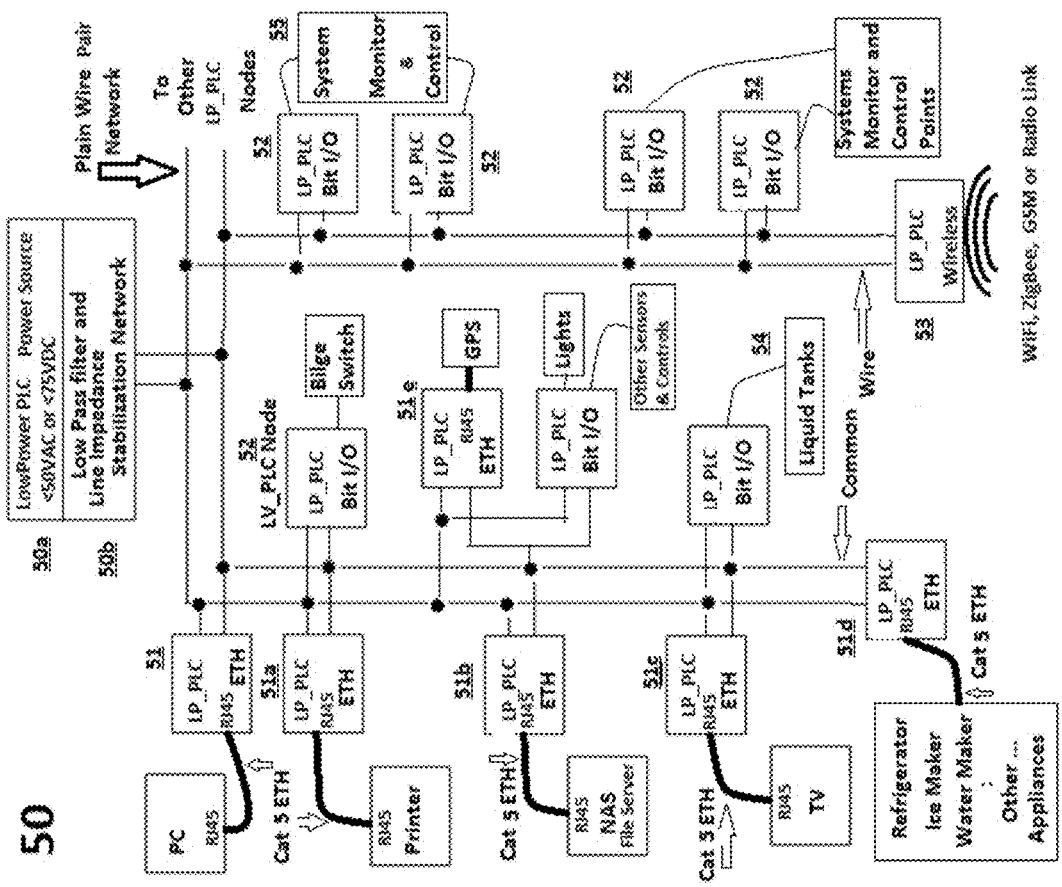
FIG. 5 is a block diagram depicting a SDSPLC network that could be found in a marine vessel application powered by a LISN conditioned power supply and utilizing impedance isolation throughout the network.

FIG. 5 depicts a high node count schematic block diagram of a preferred embodiment perhaps in a marine application. The SDSPLC Network 50 may be powered by a LP-LISN 50b Conditioned Power Supply 50a. This Powerline Communications Network block diagram shows multiple nodes delivering full data rate, as an example up to 250 Mbps to some ports while supporting low data rate, 5 Mbps communications to low speed nodes all on the same common wire pair. Both HF and HF+VHF band SDSPLC communication networks deliver the required data rate needed to each node automatically without equipment configuration changes. In one embodiment, the wired network is operably configured to exchange data between each node 51, 53, etc., at a rate from approximately 1 Kbps to 250 Mbps. As such, the present invention provides a scalable data rate delivery offering a range of system hardware costs versus performance from approximately 250 Mbps down to low cost 1 Kbps data rate. The data rate performance, length of wire of the common wire pair and distance between nodes is determined by a number of factors including node count, PLC transmit power level 80 as specified by Power Spectrum Density (PSD) measurement (as depicted in FIGS. 8a-b), electrical noise and line impairments such as high parallel capacitive reactance as well as the quality of electrical power conditioning provided by the LISN circuit. The LP-LISN conditions the system electrical power delivering a more constant impedance from 2 to 30 Mhz (or up to approximately 70 Mhz in a dual band version) for the best possible PLC signal. This is an example of a PLC compatible or friendly electric power source. A time or frequency varying change of impedance or impedance modulation is a PLC signal impairment that will dramatically reduce performance. SDSPLC technology obviates this problem. Fourteen nodes shown might be distributed over a mobile system such as a tractor trailer, car, 300-foot yacht or RV. Any vehicle or for that matter fixed lower voltage wiring system arrangement can utilize a SDSPLC Ethernet Network.

Figure 6:
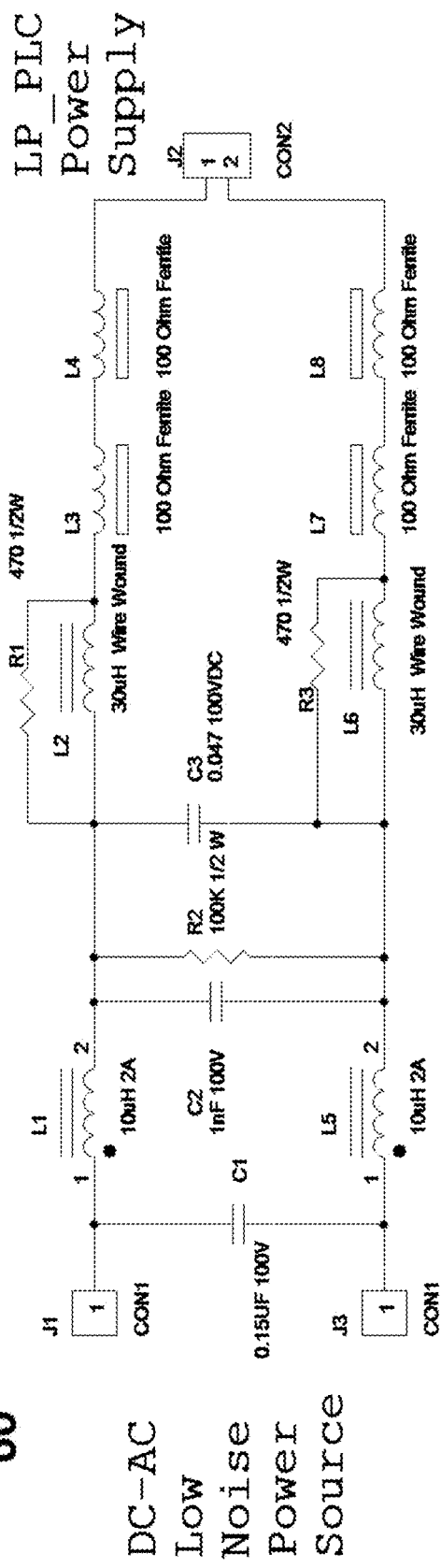
FIG. 6 is a wiring schematic depicting a direct current (DC)/alternating current (AC) LISN for a power source or load.

The LISN circuit of FIG. 6 can be reversed to extract DC or AC power to other electrical equipment loads from the PLC friendly common wire bus side without loading down or diminishing the PL signal level beyond acceptable levels. In this arrangement we can power remote equipment from the SDSPLC two wire bus.

FIG. 6 depicts a DC-AC LISN for power source or power extraction from the PL bus, wherein the right side, J2 pins 1 and 2 are PL signal compatible because of the high impedance of the circuit to PL signal energy. Note both ferrite and wire wound inductors are in series with the SDSPLC signal. The interwinding parasitic capacitance of the wire wound inductor is reduced by the ferrite inductors L3, L4, L7 and L8 in series with L2 and L5. Component placement and layout rules help reduce patristics further enhancing the performance of the SDS LP-LISN design. The left side J1 and J3 are not PL compatible due to low impedance in the communication frequency band. The Low Pass Filter (LPF) reduces noise and Balanced Line Impedance Stabilization Network (LISN) 60 shown in FIG. 6 provides impedance isolation are some of the performance enabling components of SDSPLC technology. A DC or 60 Hz AC power source maybe noisy as depicted with numerals 31a, 50a and 71 is applied to 60 connectors J1 & J3, while the power to operate the SDSPLC network is taken from low noise, high impedance, output connector J2 pins 1 and 2. This is the arrangement in block diagrams 30, 50 and 70. The J2 impedance at PL communications frequencies is hundreds of ohms but less than one ohm at DC or 60 Hz AC power frequency. Proper component selections could extend the AC power frequency up to 400 Hz if needed in aircraft applications. Electrical energy to power the network flows through the LPF-LISN, while the PL communications frequencies are isolated by by the impedance at J2. The J2 connector is PL communications 80 signal friendly, about 400 ohms, so there is very little signal load. The impedance looking into J2 over the SDSPLC communications band is designed to be as high as possible. This impedance isolation is necessary for optimum SDSPLC performance.

The reverse connection is also possible to extract electrical energy from a SDSPLC wired PL network bus. If the LPF-LISN circuit is powered by the network at connector J2 then DC or AC power can be taken from 60 connector J1 and J2 up to the current limits of the circuit components. An example of this is shown on the right side 37 of FIG. 3 block diagram 30 at outputs to 36. The electronics at 37 (sometimes referred to as "Electrical Devices") is assured continuous power from the SDSPLC network for mission critical functions.

The circuit of FIG. 6 reduces the DC or AC power source J1 & J3 noise in the communication band of 2 to 70 Mhz while delivering DC or low frequency 60 Hz (or 400 Hz) AC electrical power to operate the network at an impedance of only a few ohms. The impedance of the output of this circuit at J2 in the communications band is an impedance of approximately 400 ohms at 2 MHz so it presents a very light load to the PL signal. This load impedance can be selected by design when choosing the LISN components. In this arrangement connector J2 provides the electrical energy to power the SDSPLC network.

The LF-LISN circuit has many applications. It may be used in the SDSPLC network and test bench to provide power to the network for best SDSPLC performance measurements. The LF-LISN is also used in the front end of the SDSPLC adapters to provide power to the input of the local power supply and to isolate the low impedance and noise of these supplies from the front end of the PLC receive circuit. In this application, the LISN is providing power to the local node power supply, filtering the noise of the power supply and presenting a high impedance to the PLC signal The LISN 60 right hand side offers a consistent high impedance approximately 400-ohms to the PLC signal while providing a low impedance path for electrical energy to power the communications equipment. The two resistors in parallel with two wire wound inductors flatten the frequency response by reducing the Q of the series wire wound inductors L2, and L6 delivering a more consistent output impedance to the PLC signal. This is very desirable. The two ferrite inductors in series with each wire inductor compensate for the inherent parasitic series capacitance of the wire inductors further isolating the low impedance of the left side from the higher impedance of the SDSPLC signal 80 on the right side at J2 (depicted in FIGS. 8a-b). The four ferrite inductors have negligible series parasitic capacitance further isolating the PL signal from the power source impedance. This impedance isolation characteristic is one of the key factors in delivering SDSPLC network performance. The sum of all symmetrical components forms a balanced transmission line at the impedance J2 connector.

installations 10, 20 might work without the LISN if the common wire pair providing power was long enough to have sufficient inductance to act as a poor quality LISN but the overall performance would be lower. The Power Spectrum Density 80 (PSD) depicts a nearly flat Powerline (PL) signal strength of −50 dBm/Hz over the communication band. This signal modulates the power wiring using 1100 to 2700 different frequencies from 2 to 30 MHz (HF Band) or in some embodiments from 2 to 70 MHz for dual band modems. The eight notches in the PSD are selected HF frequencies with no transmit power output. These happen to be the Amateur Radio communications bands, but could be any frequency where PL energy must not interfere with other services. This eliminates any interference with HAM radio operations. Other notches are implemented in Europe and other countries to comply with local regulations. A half dozen Orthogonal Frequency Division Modulations (OFDM) methods are automatically selected ranging from 1024 QAM down to Robust (ROBO) mode depending on the quality of the received signal. Minimum power is transmitted to maintain good communications on a clean PL wire line, while also minimizing interference with other services.

Figure 7:
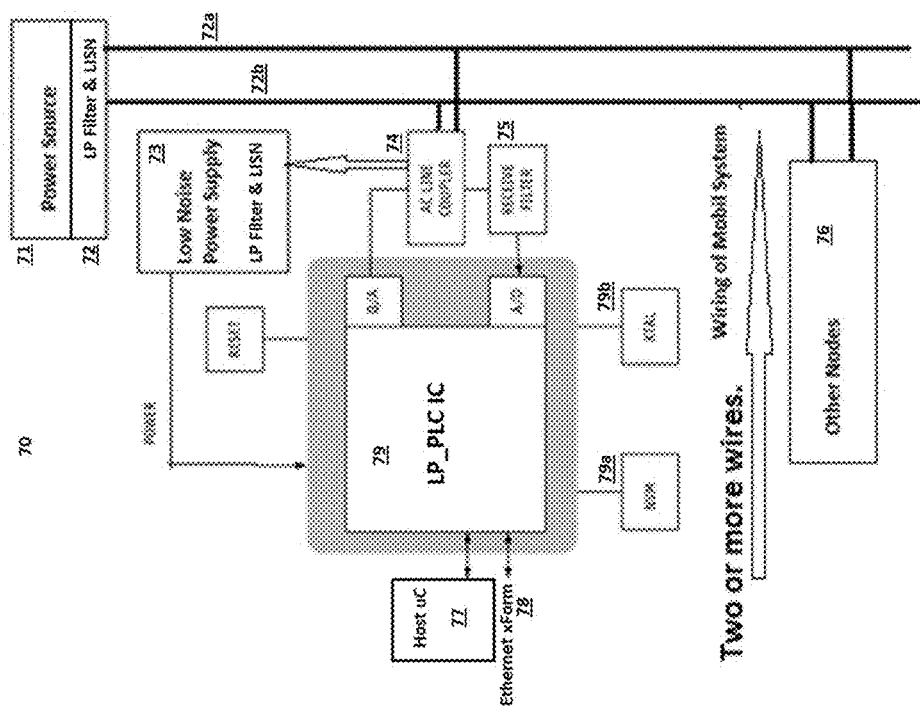
FIG. 7 is a block diagram depicting a SDSPLC with an impedance isolation power distribution wiring interface.

FIG. 7 depicts a SDSPLC Simplified Block Diagram with Power Distribution Wiring Interface. The block diagram 70 depicted in FIG. 7 illustrates an exemplary self-powered SDSPLC network. The differential PL communication signal 72a, 72b and the electric power to operate the network coexist on the same simple wire pair. The network Diagram 70 also illustrates the relationship of the AC or DC Power Source 71 delivering electrical energy to the LPF LISN input. The LISN output impedance 72 is very low, approximately 1 ohm or less at DC or 60 Hz AC yet several hundred ohms at frequencies within the PL communications 80 (PL signal) band. Quality impedance isolation is a major contributor to high performance PLC. The LISN output, on wire 72a and 72b drives electrical power to nodes 79 via LPF-LISN 72 yet presents a light load to the network PL communications signal at the AC Line Coupler 74. Find more detail on 74 in diagram 90 in FIG. 9. Block diagram 50 would use nodes configured as in diagram 70 that is a single Power Source with LPF and LISN isolated bus on wires 72a and 72b providing power and PL signal to nodes 79, 76 and a large number of nodes making up the system as shown in 50.

SDSPLC communications PL signal 80 is received (Rx) from wire pair 72a and 72b by the AC coupled line coupler circuit 74. The differential Rx signal is filtered by band pass filer 75 and passed to the analog to digital converter input of IC 79. Conversely Ethernet packetized transmit (Tx) data processed by the DSP engine 79 flows from the Digital to Analog block into the line coupler 74 to modulate the wire pair transmission line 72a and 72b.

FIG. 8a depicts an SDSPLC conducted Powerline (PL) HF band Communication Signal. The spectrum analyzer display 80 shows a constant PL signal amplitude waveform from 2 to 27 MHz at the normal operating power level of −50 dBm/Hz. This analog signal is composed of over 1000 modulated carrier frequencies or tones conveying an Ethernet digital data frame. A full 100 Mbps data rate is available at this power level and lower power levels attenuated by as much as 70 dB. Data rate diminishes to almost zero when signal attenuation reaches above 100 dB or greater. FIG. 8b depicts a dual band SDSPLC embodiment using both the HF and VHF bands. Communications reliability is greatly enhanced because there are twice as many modulated tones or data transfer frequencies used to deliver the Ethernet packet.

Figure 9:
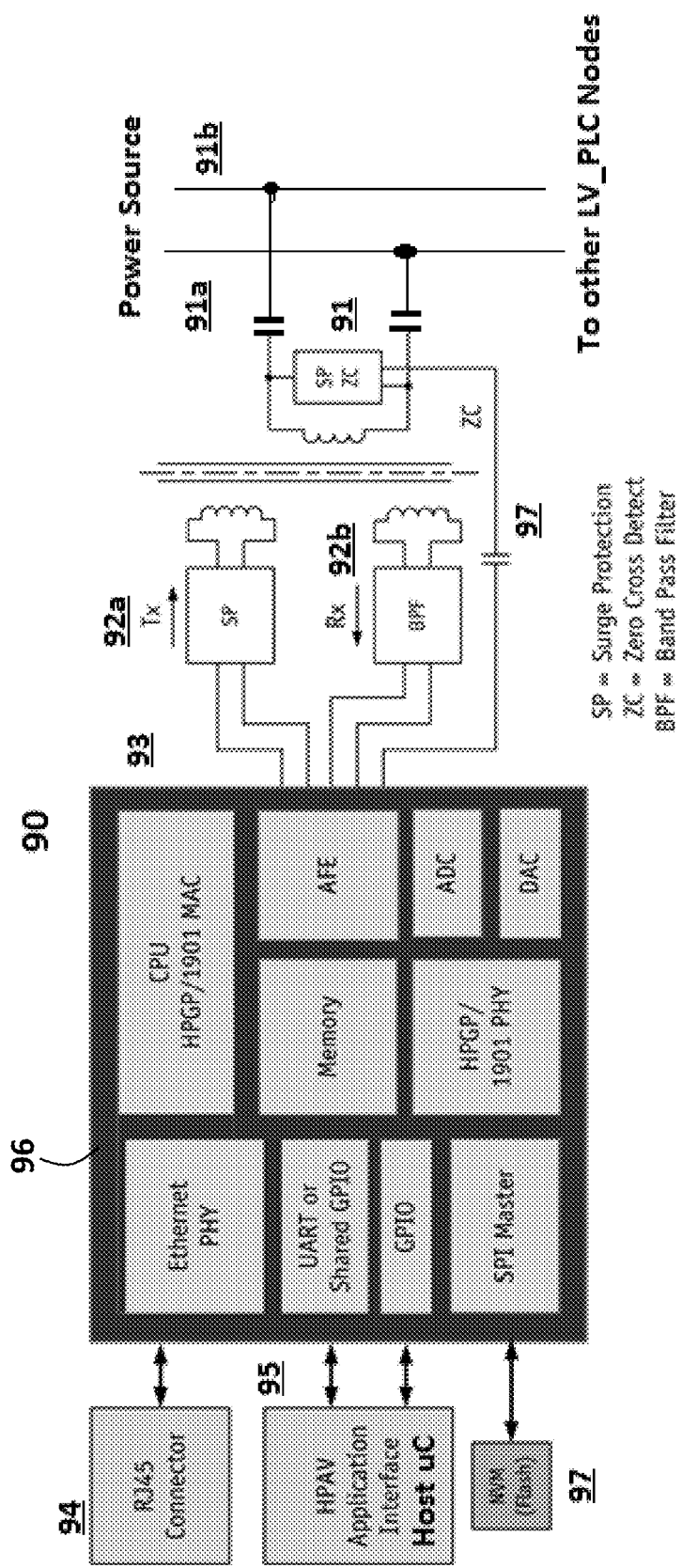
FIG. 9 is a block diagram depicting a SDSPLC node PL signal path from wire to ethernet port with external power.

FIG. 9 depicts an exemplary SDSPLC Node PL Signal Path from Wire to Ethernet Port with External Power as in 10, 20 and 40. A single IC SDSPLC node supports either an Ethernet RJ45 node via connector 94 or may be configured with multiple ICs using a host microcomputer interface via SPI/MII bus. A single IC mode can be used in a standalone (transparent) mode with only nine digital I/O bits individually configured as inputs or outputs. Many configurations are possible.

Figure 10:
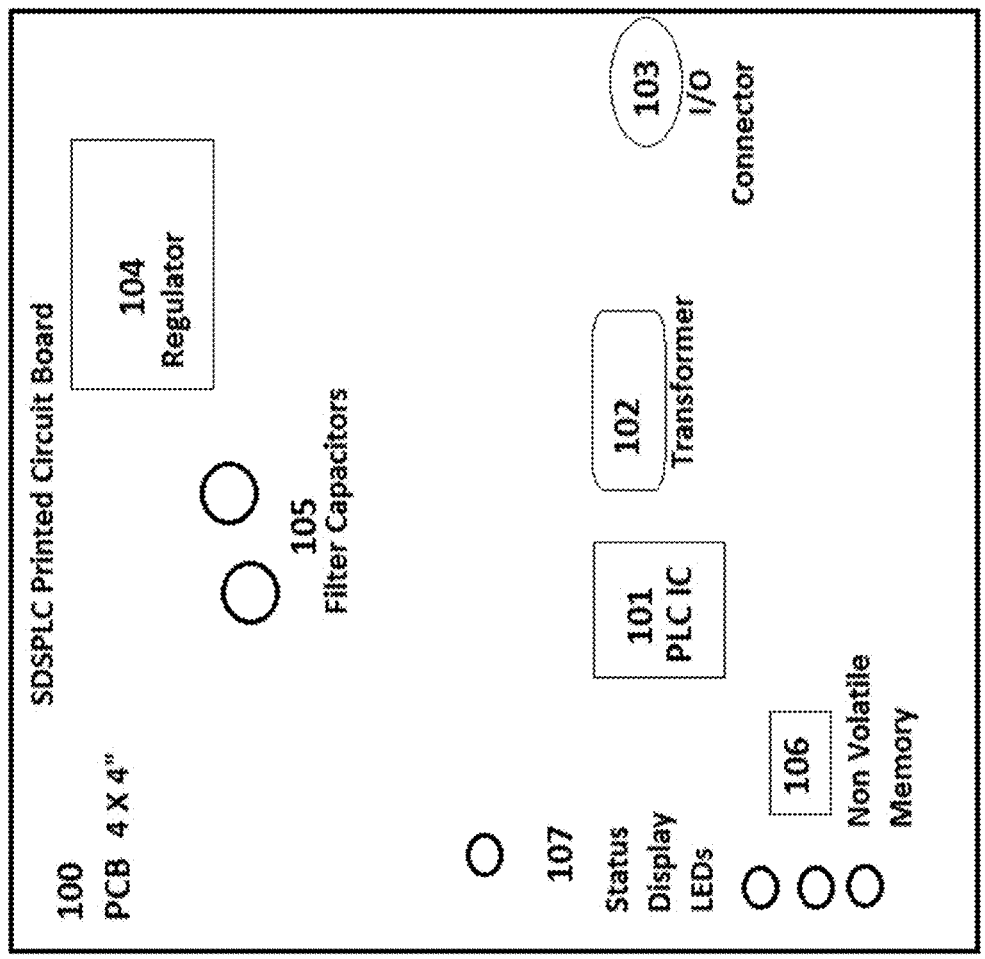
FIG. 10 is an illustration of an exemplary circuit board depicting transparent SDSPLC node for embedded application.

FIG. 10 depicts a transparent SDSPLC Node for Embedded 20, 40 Applications. An example of a simple 4-square inch prototype PCB 100 supporting a single IC 101 implementation of SDSPLC technology capable of 5 Mbps Ethernet communications interfaced by a wire pair at connector 103. Transformer 102 and two capacitors provide PL signal coupling to the digital signal processing IC engine while isolating the voltage on the wire pair. This example could be powered by the PL or an external power supply. Series regulator 104 and filter components 105 supply the internal power to the IC provided by any source. Nonvolatile Memory 106, NVM delivers the firmware and program information block information to configure the IC at power on time. The MAC address of this node and hundreds of performance parameters are also read by the IC to set power output and other operational characteristics during the power up sequence. Status information is displayed by LEDs 107 on the lower left of the PCB. As such, each node 14, 15, etc., may include an integrated circuit, e.g., circuit 96, generating a unique 6-byte (48 bit) Media Access Control (MAC) hardware address. The MAC address is capable of identifying more than 16 million nodes even if all nodes have the same Organizationally Unique Identifier (OUI) value. The exclusive function of each node is identified by its unique MAC address. An alarm or control function from any node is immediately recognized by a central controller by its solitary MAC address. Unlike those known devices, the nodes 14, 15, etc., of the present invention require little power, yet may still have a MAC address resident thereon and created by the integrated circuit.

In another embodiment of the present invention, the system may provide transparent communication between two or more large groups of networks implemented by imbedding the SDSPLC data into a higher-level Internet Protocol IP address system, such as 32-bit IPV4 or 128-bit IPV6. SDS network to network or Internet communications is implemented by using the Open Systems Interconnection (OSI) model, but requires more expensive hardware processing power. SDSPLC supports lower cost MAC level communications hardware required less processing resources to transfer data between nodes within a local network. Therefore, large number of networked nodes meet the need of large systems. A MAC address can be either a 32-bit IPV4 or 128-bit IPV6 format Internet Protocol (IP) address. Each of the 4 billion IPV4 decimal or IPV6 hexadecimal infinite number or a Media Access Control (MAC) address or both. An example of the format of an IP address: 192.168.1.200. A node's Media Access Control (MAC) address is the most basic and provides unique point to point communications between any two or more node locations.

The single IC provides a transparent CSMA/CD Ethernet multi drop data pipe between all nodes using a fully connected topology by making a two-wire connection 103 to the wire pair as shown in FIG. 9.

Figure 11:
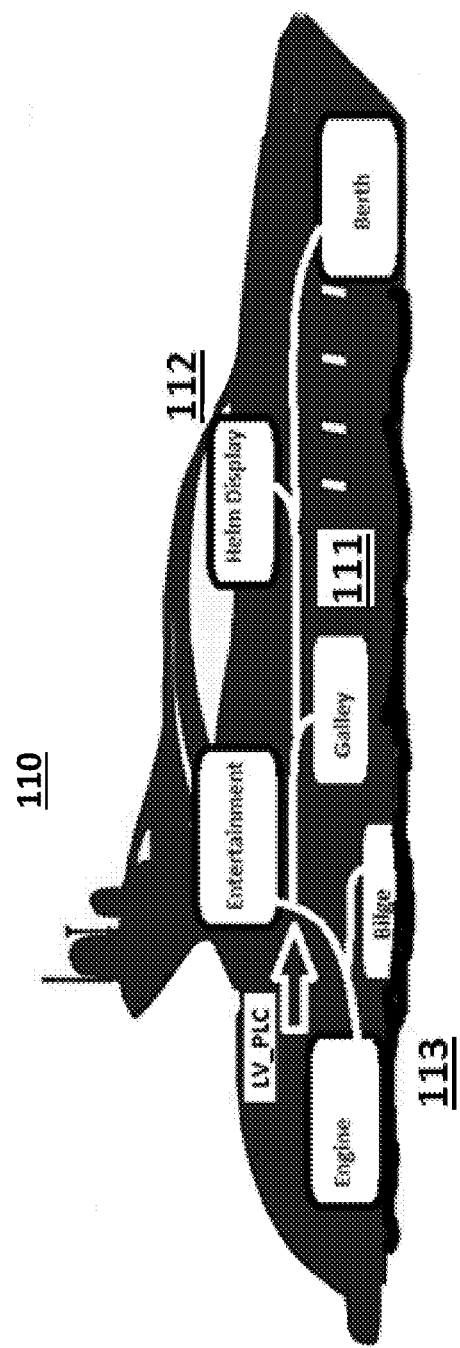
FIG. 11 is a schematic diagram depicting exemplary marine SDSPLC application with node locations.

FIG. 11 depicts exemplary marine SDSPLC Node Locations. Specifically, FIG. 11 illustrates a maritime SDSPLC application collecting data from the ship's machinery, liquid tanks and sensors 113 throughout the vessel and presenting that data at any node location especially the helm 112 display. The command and control helm computer constantly scan all nodes to monitor and confirms continuous reliable operation of the SDSPLC system. Monitoring the refrigerator or any appliance in the galley 111 is simply a matter of making an RJ45 cable connection. Any node failing to respond to a status check is immediately identified and reported on any data display anywhere in the vessel.

The 100 Mbps or optionally 500 Mbps Powerline bus data rate is more than sufficient to support dozens of data streams, audio and HD video channels for entertainment or ships services on the same wired network. Wired communications make optional wireless communications links more available by sharing the data distribution task. Data path redundancy is also a benefit for critical services.

FIG. 12 depicts a SDSPLC-Ethernet Mobile System 120 in a Sport Utility Vehicle (SUV). Another SDSPLC communication application example is the Sports Utility Vehicle 120. An Ethernet network is formed by simply plugging in two or more SDSPLC bridge modules 122 into a cigarette lighter 124 receptacles. Each module delivers a 100 Mbps Ethernet port. Other examples include an RV trailer or bus, trucks including big rigs and emergency vehicles of all types. SDSPLC technology supporting several dozen Ethernet nodes was successfully demonstrated using the unconditioned 12VDC wiring system of a production SUV automobile.

FIG. 13 depicts an exemplary SUV Mobile System 130 SDSPLC with various exemplary node locations. FIG. 13 shows the Ethernet connection points, example 131, locations available in a standard SUV example 120. This is an example of a two-wire SDSPLC network with up to five Ethernet ports, without power conditioning delivering typically 40 Mbps data rate to each node.

Figure 14:
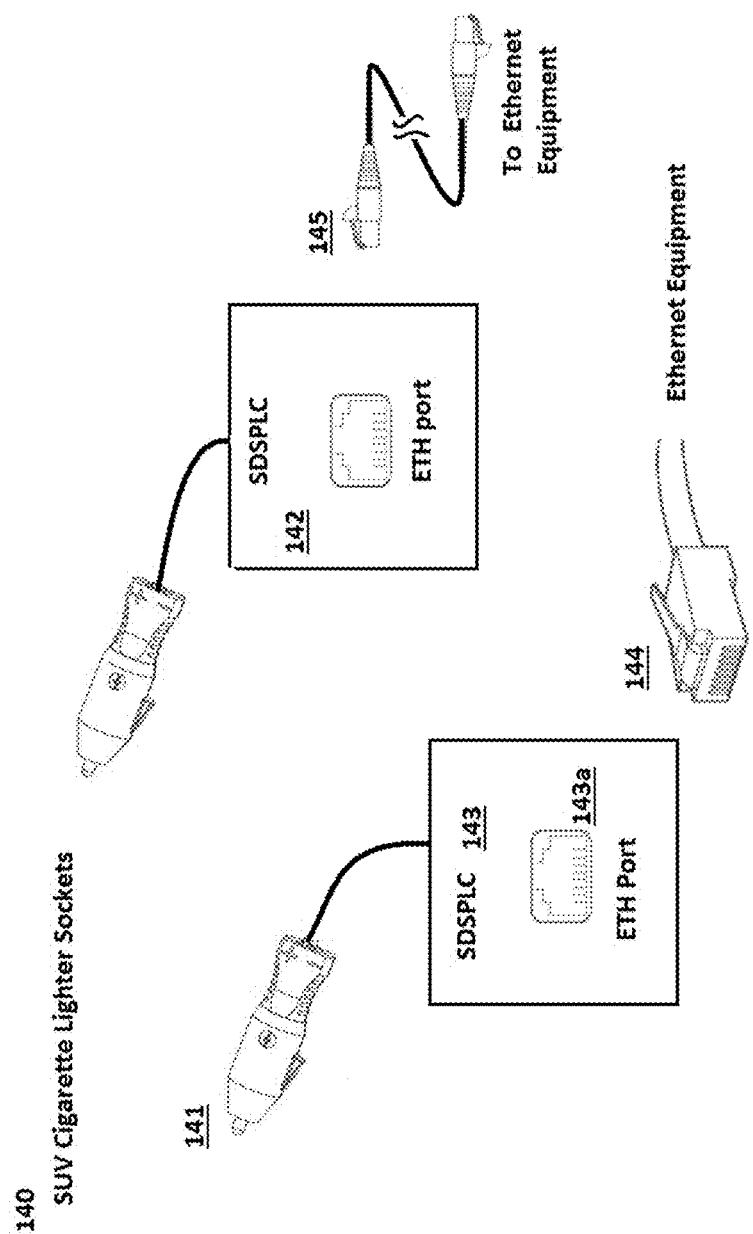
FIG. 14 is an illustration of exemplary SDSPLC Ethernet nodes in accordance with one embodiment of the present invention, particularly RJ45 Interface and 12V power distribution wire pair.

FIG. 14 depicts exemplary SDSPLC-Ethernet Nodes utilized in an exemplary wired data network, wherein said notes include an RJ45 Interface and 12V Power Distribution Wire. Said system of nodes 140 demonstrates how simple it is to create a SDSPLC Ethernet network. The pigtail wires from two SDSPLC modules are twisted together and connected to a power source. In this case simple wire nuts are used to connect the two wire pairs to a Low Power, 12 VDC, low noise power supply. Any two or more modules form an instant self-managed data network that can be used as a communication backbone or in addition to radiated communications, such as Wi-Fi. This example was built by modifying off-the-shelf PLC wall adapter devices and deliver full data rate to a dozen nodes.

The unique trade secrets described here pertain specifically to Low Power, Lower Voltage distribution wired communication using SDSPLC networks. This technology is implemented in three types of SDSPLC bridging adapter node designs. These types are: (1) SDSPLC-Ethernet: delivers transparent IEEE 802.3 Ethernet via RJ45 (or similar) connector, (2) SDSPLC-Host: Multiple RS232 serial, parallel, USB, CAN, LIN or analog and bit by bit input/output, and (3) SDSPLC-No Host: provides nine (9) single bit configurable input/output logic signals.

These PLC implementations are made possible by trade secrets including but not limited to: impulse tolerant signal coupling, ultra-low noise (less than approximately 100 dBm) power supply design, high input impedance bandpass, Line Impedance Stabilization Networks (LISN), Low Pass power filters and other unique circuit innovations required by SDSPLC technology. Every galvanic connection to the Powerline (PL) wire pair is isolated by the impedance of the LISN and further conditioned by the Low Pass Filter circuits. The key function of the conditioning circuits is to pass current in either direction through the filter network, from power source to the networks PL wire pair or current from the PL wire pair to power SDSPLC equipment or other loads with low data rate loss. The conditioning network must pass current with as little voltage drop as possible and yet present acceptable impedance to the SDSPLC network. The performance of the network is directly proportional to the quality, size, placement and component interconnect arrangement. These circuit designs are unique and challenging as compared to higher voltage, greater than 90V, technology found in existing PLC products used in residential 110-240 VAC home wiring today.

Implementations

Wired data communication systems in the past required at least two wires to transfer bidirectional data on a balanced transmission line and two wires to power the equipment. Previously, every node used a four-wire connection to the network. The SDSPLC methods, circuits and technology described here requires only a two-wire connection. The plain wire connection provides both electrical power for the network and the conducted communication media. A 50% reduction in wiring is achieved. Elimination of the communication wiring saves cost, weight, labor and accelerates instillation of the communication system. This technology is especially important in lowering the cost of communications in mobile platforms desiring reduction of weight, cost and labor.

Powerline Communication (PLC) equipment designed for Low Voltage Directive (LVD) operation typically operate on 100 to 374 VAC, 50/60 Hz wiring systems found in a home, office or commercial buildings. These products are well defined and have been available for many years from a large number of manufacturers. These products meet the HomePlug®, HomePlug® AV or HomePlug® AV2 standards. These are not the subject of this disclosure but mentioned here to differentiate SDSPLC from HomePlug® implementations designed to operate at voltages below the Low Voltage Directive (LVD) 2014/35/EU. Examples of HomePlug® products are commonly found in TP-Link AV500, NETGEAR PLP1200 and many other readily available consumer products. SDSPLC design and technology is different from HomePlug® and solves the challenges of Lower Voltage, Low Power Ethernet Communication technology on common wire. The unique trade secrets described here pertain specifically to Lower voltage, Low Power distribution used in SDSPLC communication networks.

SDSPLC implementations include, as depicted in FIG. 14, a transparent 100 Mbps, IEEE 802.3 Ethernet communications from a 12V powered, wire pair 141 to a standard RJ45 connector 143a, 144 and 145. The wire pair 141 is a PL communications bus and power source for the network modems. Referring to the block diagram drawing in FIG. 5, any Ethernet ready PC, printer, Network Access Server 51 (NAS), Wi-Fi router 53, Ethernet ready appliance 51 joins a network by simply connecting it to a SDSPLC module as shown in diagram 140. The Ethernet bridge modules 142 and 143 require no configuration and simply provides a remote self-managed, transparent, Ethernet pipe without adding any new Ethernet communication wiring.

The SDSPLC No Host embodiment of SDSPLC is the lowest cost, lower data rate version and is idea for remote machine monitoring and control. A 5 Mbps data rate channel communicates single bit data to or from any SDSPLC No Host node to a data monitor via an Ethernet channel. One application would be a simple bilge water level alarm. A single contact closure or up to nine bits of digital input/output are communicated without host processor support. These arrangements could be illustrated in FIGS. 1-5 along with the host supported embodiments.

The SDSPLC-Host embodiment is a more versatile realization of the invention and conveys a wide variety and larger number of digital and analog signals such as liquid levels in tanks, voltages and electrical current measurement at remote locations to a central data display such as a laptop PC or touch screen display terminal. The SDSPLC host processor expands I/O and local intelligence of the node. The number of channels of date may be only one to hundreds of data streams. Any condition at any location in the system connected by the same Lower Voltage distribution wiring system automatically provides the appropriate data rate channel. Special algorithms force the low data rate communications to occupy a fraction (about 12 percent) of the available conducted high-speed data bus transmission bandwidth supporting delivery of real-time data such as streaming video as well as low speed data reliably. Hazardous situations can override this allocation for alarms and quick response systems when needed. These arrangements are illustrated in FIGS. 1-5 references 19, 26, 39a, 44, and 52.

In higher data rate embodiments, a Powerline Communication Impedance Stabilization Network (LPF-LISN) hardware circuit design 60 illustrated in FIG. 6, component selection and manufacturing technology play a key role in the performance of SDSPLC systems. The LISN 60 circuit illustrated in FIG. 6 is also shown in drawings of FIG. 3 (numeral 32), FIG. 5 (numeral 50b), and FIG. 7 (numeral 72).

Referring now to FIG. 9, the combined multi stage, balanced line 91, low-pass and band pass 92b filters designs provide receive sensitivity of better than −100 dBm below the global harmonized reference level of: −50 dBm/Hz. Pseudo ground and zero crossing 97 in AC powered applications assure the lowest possible impairment from phase angle synchronized noise in the AC powerline case.

SDSPLC-TestMAC is a software suite of programs based on Qualcomm PLC Toolkit designed to discover and report status of SDSPLC nodes using only their MAC address. These programs are also used for bench test and final system verification during manufacturing and instillation. TestMAC is also useful for malfunction detection and constant system monitoring of end user applications. Low-cost SDSPLC-No Host applications do not have a host processor or might have a very simple host processor with no Internet Protocol (IP) address stack thus no IP software response. The underlying Toolkit programs monitor and provide a continuous display of the system wide network status of every node. Communications presence and reliability of each node is automatically monitored, recorded and reported to a display screen. Any node that fails to respond is immediately reported and may cause an alarm condition.

The SDSPLC-Test Bench is a set of tools and techniques for the measurement of PLC performance. These tools include LISNs, signal attenuators, noise sources and signal coupling methods for examination and documentation the operation of SDSPLC products.

Many modifications and other embodiment of the invention will come to mind to one skilled in the art to which the invention(s) pertain having the benefit of the teachings presented in the foregoing descriptions, and the associated drawings. Therefore, it is to be understood that the invention(s) are not to be limited to the specific embodiments disclosed. Although specific terms are employed herein, they are used in a generic and descriptive sense only and not for purposes of limitation.

Although the above figures or description may describe or depict a specific order of executing the process steps, the order of executing the steps may be changed relative to the order shown in certain embodiments. Also, two or more blocks in depicted block diagrams shown in succession may be executed concurrently or with partial concurrence in some embodiments. Certain steps or blocks may also be omitted in the figures for the sake of brevity. In some embodiments, some or all of the process steps included in figures can be combined into a single process.

Additionally, a low power and wired data communication network has been disclosed and includes a specialized LPF-LISN 60 and low-pass filter circuits L1, L5, C1 and C2 isolating the power sources, power loads and located at each node, 30 and 50 described in this patent, provide optimized performance delivering maximum distance, highest data rate and largest number of Ethernet Powerline communication nodes.

The LISN circuits provide impedance isolation between the wired communications medium and the electrical energy power source and/or redundant power sources. All low impedance power loads including each node's internal power supply is also isolated by appropriate LISN circuits to present an operating environment favorable to SDSPLC communications. Transparent, bidirectional data rates up to 100 Mbps using IEEE802.3 Ethernet Protocol Communication bridge over plain ordinary wire found in low power distribution wiring.

Aggregate data rate on the plain wire Powerline (PL) data bus may reach 500 Mbps. The highly reliable and highly available Low Power plain wire pair of conductors provide both electrical energy to power the communication equipment and the communication medium as well as providing power to essential electrical equipment needed in an emergency.

SDSPLC communications is by means of conducted signaling on two plain wires, not radiated signals as in radio communication networks such as Wi-Fi, Bluetooth or Zigbee which are subject to EMI and RFI affects. System data security is enhanced by SDSPLC compared to radiated communications because a direct physical wire connection is required to establish communications rather than a radio link in the vicinity of the network. Any new attachment is immediately detected and reported as an abnormal condition.

Network status of each node may be monitored and reported by the SDSPLC-Host node. Atypical conditions such a low data rate, a missing node or low voltage on the wire pair causes an alarm condition resulting in audible/visual signals along with email and text message transmission via SDSPLC, cellphone and/or other long-distance radio communication methods. SDSPLC eliminates expensive communication signal Ethernet cable. Moreover, the SDSPLC delivers higher aggregated data rate, and is more reliable over equivalent distance than radiated communication methods and at a lower cost.

SDSPLC has negligible interference issues from atmospheric disruptions using wire conducted communications as compared to radiated signal communication systems such as Wi-Fi, Bluetooth, Zigbee or other radio communication systems. SDSPLC modems utilize specialized Balanced Line Impedance Stabilization Network (LISN) circuits to provide electrical power from low noise, impedance conditioned power supplies thus delivering PL communications at higher data rates and over longer distance than typical PLC. Ultra-low noise, −100 dBm/Hz over the signal band, power supplies are used to enable high performance SDSPLC communications at longer distances of thousands of meters. High impedance, greater than 400 ohms @ 2 MHz, band-pass filters enable closely spaced SDSPLC nodes to communicate with minimum loading of the plain wire pair. SDSPLC may use the mobile system (example yacht) existing wiring for power and communications to multiple points without PL wire conditioning LISN circuits if lower performance is acceptable.

Communications signal may be conducted on power wiring that is low cost, plain and ordinary wire as opposed to Ethernet cable. There is no need for Ethernet cables or Ethernet hubs. SDSPLC is compatible with Ethernet hubs, switches and radiated communications equipment like Wi-Fi when needed to expand the number of Ethernet ports to the destination location. Communications uses the same two wires providing Lower Voltage electrical energy throughout the vehicle, vessel or aircraft.

SDSPLC modems act as a bridge and multi-port Ethernet hub for up to 64 ports or nodes in any location connected to the mobile system power wiring system. Communication node capabilities are also available with some increase in network latency. Internet Protocol servers expand the number of possible nodes into the millions.

Compatible with DHCP address assignment or fixed IP address configurations. PL_PLC may also use Media Access Control (MAC) node address when there is no host process IP address. Power load affects physical range but communication distance of hundreds of meters or more in most situations us achieved by balanced LISN circuits. Longer physical range and higher node count with dedicated twisted pair wiring and specialized circuit arrangements.

A SDSPLC Node can be integrated directly into electronics apparatus or appliances such as a PC, video monitor, TV, printer, GPS, refrigeration, engine monitor, fuel, bilge or any electronic equipment/appliance. SDSPLC by its self is not intended for propulsion, steering or transmission control. The assembly may support USB, RS232, 20 ma current loop and other physical media transportable by IEEE802.3 protocol via local host processor embedded in the SDSPLC-Host node.

Low latency time, generally less than 40 milliseconds in a 64-node configuration. SDSPLC communications offers faster data rate, equivalent distance and lower cost than Wi-Fi or Evolved High Speed Packet Access, (HSPA+) radiated communication technology. The assembly may also support any 802.3 device such as IP camera, security system, PC, printer, bilge detector, liquid level sensor, battery monitor and Wi-Fi bridge for extending a wireless network.

As part of a hybrid network, LP+PLC enabled products support wired devices while freeing up wireless bandwidth for mobile devices not connected to power distribution wiring. This improves data bandwidth available to equipment that only have access to the wireless network.

A user may input an 8 to 64-character password that generates a secret initialization vector for 128-bit Advanced Encryption Standard (AES) Link Data Encryption. Once the password is entered into system it cannot be read back. Alternatively, a physical pushbutton procedure will also generate a random network password automatically adding new nodes to an existing network system. Multiple encrypted networks may also coexist simultaneously on the same communication wire pair. Data is confidential and only available to members of the unique network nodes.

Figure 15:
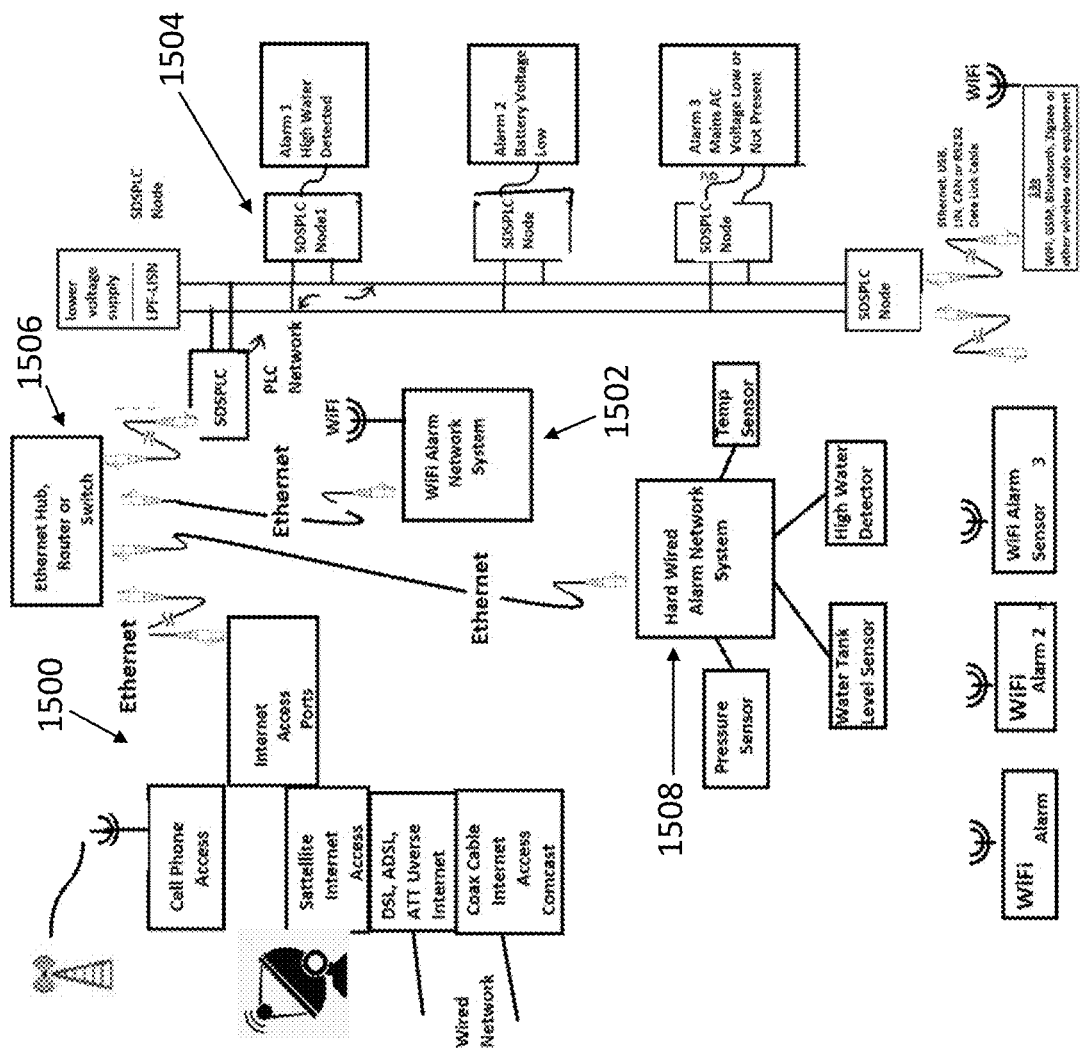
FIG. 15 depicts is a block diagram depicting a triple redundant communication system using all three media types, wired, wireless and SDSPLC Ethernet in accordance with one embodiment of the present invention.

With reference now to FIG. 15, a block diagram depicting a triple redundant communication system using all three media types, wired, wireless and SDSPLC Ethernet is shown. The configuration assures high reliability and instant fault detection and recovery mechanisms between sensors and the Internet. Communication with the World Wide Web is also supported by multiple wireless and wired methods. SDSPLC can easily form an ultra-reliable, triple redundant Ethernet to Internet bridge system by using three types of communication media. Hardwired Ethernet Category 5 (or better) cable coupled with wireless Ethernet and SDSPLC uses all three types of network communication media in one system to deliver high reliability and high availability data transfer.

FIG. 15 depicts all three communications methods combined to detect alarm conditions to an Ethernet Hub or Hubs communicating to external assets to monitor and control the status of a vehicle, vessel, mobile or fixed base system. External communications are also redundant due to multiple wireless and wired Internet access. Cloud data monitoring is made possible and cost effective to every node location by means of three type of data transfer. Multiple sensors from different or the same parameter is achieved by all three communication systems. Said another way, FIG. 15 can be seen depicting an Ethernet network 1500 operably configured to enable Internet connectivity and to independently and simultaneously exchange data with respect to the Wi-Fi network 1502 and wired network 1504. An Ethernet hub 1506 is also shown, wherein the Ethernet hub 1506 is communicatively coupled to the Ethernet network 1500, the Wi-Fi network 1502, and the wired network 1504 (also referred to herein as the SDSPLC), thereby generating the triple redundant, fault tolerant (i.e., if two of the networks 1500, 1502, 1504 are not working, it will not affect the working one of the networks 1500, 1502, 1504), and self-healing (i.e., automatic copying of data between networks 1500, 1502, 1504) Ethernet to Internet bridge system. A hard-wired alarm network system 1508 is also depicted, wherein the hard-wired alarm network system 1508 is communicatively coupled to the hub 1506 and is operably configured to detect one or more vehicle or vessel conditions, e.g., high water level, tank overflow, battery voltage level, etc., utilizing one or more sensors. As such, the configuration depicted in FIG. 15 provides an effective and efficient system to monitor and control the status of a vehicle or vessel via Internet access.

What is claimed is:

1. An impedance isolated lower voltage and wired data communication network comprising:
    a first communication node and a second communication node, the first and second communication nodes:
        each, respectively, including an Ethernet port electrically coupled to a first external power source at a lower voltage and including an AC/DC low pass filtering circuit and a LISN circuit configuration interposed between the first external power source and the first and second communication nodes; and
        communicatively coupled to one another through a wired connection, forming a wired network operably configured to exchange data between one another; and
    an auxiliary AC/DC low pass filter and LISN configuration creating a backup power source should the first external power source fail.

2. The impedance isolated low power and wired data communication network according to claim 1, wherein:
    the first and second communication nodes are communicatively coupled to one another through a paired wired connection, wherein the paired wired connection is of a copper material.

3. The impedance isolated low power and wired data communication network according to claim 1, wherein:
    the lower voltage is within a range of approximately 6-55V.

4. The impedance isolated low power and wired data communication network according to claim 1, further comprising:
    a Wi-Fi network of communication devices communicatively coupled together and operably configured to enable Internet connectivity, the wired network formed by the first and second communication nodes is a supplemental and redundant network associated with the Wi-Fi network.

5. The impedance isolated low power and wired data communication network according to claim 1, wherein:
    the first and second communication nodes are communicatively coupled to one another through a dual-band wired connection, wherein the dual-band wired network is operably configured to exchange data between one another at a rate from approximately 1 Kbps to 250 Mbps.

6. The impedance isolated low power and wired data communication network according to claim 1, wherein the first and second communication nodes each further comprise:
    an integrated circuit generating a unique Media Access Control hardware address.

7. The impedance isolated low power and wired data communication network according to claim 2, wherein:
    the paired wired connection is of a twisted configuration spanning from the AC/DC low pass filtering circuit and the LISN circuit configuration to the first communication node.

8. The impedance isolated low power and wired data communication network according to claim 2, wherein:
    the first and second communication nodes are communicatively coupled to one another through a three-wired connection with one of the three wires operably configured to only deliver the electricity from the first external power source.

9. An impedance isolated low power and wired data communication network comprising:
    a first communication node and a second communication node, the first and second communication nodes:
        each having a housing defining an Ethernet port electrically coupled, respectively, to a first external power source at a voltage less than at least one of 50 VAC and 75 VDC and including an AC/DC low pass filter and LISN configuration; and
        communicatively coupled to one another through a wired connection to form a wired network operably configured to exchange data between one another.

10. The impedance isolated low power and wired data communication network according to claim 9, further comprising:
    an auxiliary AC/DC low pass filter and LISN configuration creating a backup power source should the first external power source fail.

11. The impedance isolated low power and wired data communication network according to claim 9, further comprising:
    a Wi-Fi network of communication devices communicatively coupled together and operably configured to enable Internet connectivity, the wired network formed by the first and second communication nodes is a supplemental and redundant network associated with the Wi-Fi network.

12. The impedance isolated low power and wired data communication network according to claim 10, wherein:
    the first and second communication nodes are communicatively coupled to one another through a paired wired connection, wherein the paired wired connection is of a copper material.

13. The impedance isolated low power and wired data communication network according to claim 11, wherein:
    the Wi-Fi network and wired network are operably configured to independently and simultaneously exchange data.

14. The impedance isolated low power and wired data communication network according to claim 12, wherein:
    the paired wired connection is of a twisted configuration spanning from the AC/DC low pass filtering circuit and the LISN circuit configuration to the first communication node.

15. The impedance isolated low power and wired data communication network according to claim 13, further comprising:
    an Ethernet network operably configured to enable Internet connectivity and to independently and simultaneously exchange data with respect to the Wi-Fi network and wired network; and
    an Ethernet hub communicatively coupled to the Ethernet network, the Wi-Fi network, and the wired network, thereby generating a triple redundant, fault tolerant, and self-healing Ethernet to Internet bridge system.

16. The impedance isolated low power and wired data communication network according to claim 14, wherein:
    the lower voltage is within a range of approximately 6-55V.

17. The impedance isolated low power and wired data communication network according to claim 16, wherein:
    the wired network is operably configured to exchange data between one another at a rate from approximately 1 Kbps to 250 Mbps.

18. The impedance isolated low power and wired data communication network according to claim 17, wherein the first and second communication nodes further comprise:
    an integrated circuit generating a unique Media Access Control hardware address.

19. An impedance isolated lower voltage and wired data communication network comprising:
a first communication node and a second communication node, the first and second communication nodes:
each, respectively, including an Ethernet port electrically coupled to a first external power source at a lower voltage and including an AC/DC low pass filtering circuit and a LISN circuit configuration interposed between the first external power source and the first and second communication nodes; and
communicatively coupled to one another through a three-wired wired connection of a copper material, forming a wired network operably configured to exchange data between one another, and with one of the three wires operably configured to only deliver the electricity from the first external power source.

20. An impedance isolated lower voltage and wired data communication network comprising:
a first communication node and a second communication node, the first and second communication nodes:
each, respectively, including an Ethernet port electrically coupled to a first external power source at a lower voltage and including an AC/DC low pass filtering circuit and a LISN circuit configuration interposed between the first external power source and the first and second communication nodes; and
communicatively coupled to one another through a dual-band wired connection, forming a wired network operably configured to exchange data between one another, wherein the dual-band wired network is operably configured to exchange data between one another at a rate from approximately 1 Kbps to 250 Mbps.

* * * * *